(12) United States Patent
Kosowsky et al.

(10) Patent No.: US 9,208,931 B2
(45) Date of Patent: Dec. 8, 2015

(54) VOLTAGE SWITCHABLE DIELECTRIC MATERIAL CONTAINING CONDUCTOR-ON-CONDUCTOR CORE SHELLED PARTICLES

(75) Inventors: Lex Kosowsky, San Jose, CA (US); Robert Fleming, San Jose, CA (US); Junjun Wu, Woodbury, MN (US); Pragnya Saraf, San Jose, CA (US); Thangamani Ranganathan, San Jose, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 12/638,360

(22) Filed: Dec. 15, 2009

(65) Prior Publication Data

US 2010/0090176 A1 Apr. 15, 2010

Related U.S. Application Data

(63) Continuation-in-part of application No. 12/571,318, filed on Sep. 30, 2009.

(60) Provisional application No. 61/101,637, filed on Sep. 30, 2008.

(51) Int. Cl.
*H01B 1/22* (2006.01)
*H01C 7/108* (2006.01)
(Continued)

(52) U.S. Cl.
CPC .................. *H01C 7/108* (2013.01); *H01B 1/20* (2013.01); *H01B 1/22* (2013.01); *H01B 1/24* (2013.01); *H05K 1/0257* (2013.01); *H01L 2924/00013* (2013.01); *H01L 2924/01013* (2013.01); *H01L 2924/01029* (2013.01); *H01L 2924/01046* (2013.01); *H01L 2924/01058* (2013.01); *H01L 2924/01078* (2013.01); (Continued)

(58) Field of Classification Search
CPC .......... C08K 3/08; B82Y 40/00; H01L 33/56; C09D 5/24; H01B 1/22; H01B 1/02; H01B 1/20; H01G 9/0032; H01M 4/48
USPC ............. 361/117, 126; 338/21; 977/773, 774; 252/518.1, 519.3, 519.33
See application file for complete search history.

(56) References Cited

U.S. PATENT DOCUMENTS 3,239,465 A 3/1966 Rheinfrank
3,347,724 A 10/1967 Schneble, Jr. et al.
(Continued)

FOREIGN PATENT DOCUMENTS

CH 663491 A5 12/1987
CN 101261892 A 9/2008
(Continued)

OTHER PUBLICATIONS

U.S. Appl. No. 11/903,820, filed Sep. 24, 2007, Kosowsky et al.
(Continued)

*Primary Examiner* — Khanh Tuan Nguyen
*Assistant Examiner* — Haidung Nguyen
(74) *Attorney, Agent, or Firm* — Kacvinsky Daisak Bluni PLLC (57) ABSTRACT

A composition of voltage switchable dielectric (VSD) material that comprises a concentration of core shelled particles that individually comprise a conductor core and a conductor shell, so as to form a conductor-on-conductor core shell particle constituent for the VSD material.

28 Claims, 5 Drawing Sheets

(51) Int. Cl.
  *H01B 1/20* (2006.01)
  *H01B 1/24* (2006.01)
  *H05K 1/02* (2006.01)
  *H05K 1/03* (2006.01)
(52) U.S. Cl.
  CPC .... *H01L 2924/01079* (2013.01); *H05K 1/0259* (2013.01); *H05K 1/0373* (2013.01); *H05K 2201/0218* (2013.01); *H05K 2201/0738* (2013.01)

(56) References Cited

U.S. PATENT DOCUMENTS

| | | | |
|---|---|---|---|
| 3,685,026 A | 8/1972 | Wakabayashi et al. | |
| 3,685,028 A | 8/1972 | Wakabayashi et al. | |
| 3,723,635 A | 3/1973 | Smith | |
| 3,808,576 A | 4/1974 | Castonguay et al. | |
| 3,926,916 A | 12/1975 | Mastrangelo | |
| 3,977,957 A | 8/1976 | Kosowsky et al. | |
| 4,113,899 A | 9/1978 | Henry et al. | |
| 4,133,735 A | 1/1979 | Afromowitz et al. | |
| 4,252,692 A | 2/1981 | Taylor et al. | |
| 4,331,948 A | 5/1982 | Malinaric et al. | |
| 4,359,414 A | 11/1982 | Mastrangelo | |
| 4,405,432 A | 9/1983 | Kosowsky | |
| 4,439,809 A | 3/1984 | Weight et al. | |
| 4,506,285 A | 3/1985 | Einzinger | |
| 4,591,411 A | 5/1986 | Reimann | |
| 4,642,160 A | 2/1987 | Burgess | |
| 4,702,860 A | 10/1987 | Kinderov et al. | |
| 4,726,877 A | 2/1988 | Fryd et al. | |
| 4,726,991 A | 2/1988 | Hyatt et al. | |
| 4,799,128 A | 1/1989 | Chen | |
| 4,888,574 A | 12/1989 | Rice et al. | |
| 4,892,776 A | 1/1990 | Rice | |
| 4,918,033 A | 4/1990 | Bartha et al. | |
| 4,928,199 A | 5/1990 | Diaz et al. | |
| 4,935,584 A | 6/1990 | Boggs | |
| 4,977,357 A | 12/1990 | Shrier | |
| 4,992,333 A | 2/1991 | Hyatt | |
| 4,996,945 A | 3/1991 | Dix, Jr. | |
| 5,039,452 A | 8/1991 | Thompson et al. | |
| 5,068,634 A | 11/1991 | Shrier | |
| 5,092,032 A | 3/1992 | Murakami | |
| 5,095,626 A | 3/1992 | Kitamura et al. | |
| 5,099,380 A | 3/1992 | Childers et al. | |
| 5,126,915 A * | 6/1992 | Pepin et al. | 361/304 |
| 5,142,263 A | 8/1992 | Childers et al. | |
| 5,148,355 A | 9/1992 | Lowe et al. | |
| 5,183,698 A | 2/1993 | Stephenson et al. | |
| 5,189,387 A | 2/1993 | Childers et al. | |
| 5,220,316 A | 6/1993 | Kazan | |
| 5,246,388 A | 9/1993 | Collins et al. | |
| 5,248,517 A | 9/1993 | Shrier et al. | |
| 5,252,195 A | 10/1993 | Kobayashi et al. | |
| 5,260,108 A | 11/1993 | Braren et al. | |
| 5,260,848 A | 11/1993 | Childers | |
| 5,262,754 A | 11/1993 | Collins | |
| 5,278,535 A | 1/1994 | Xu et al. | |
| 5,282,312 A | 2/1994 | DiStefano et al. | |
| 5,294,374 A | 3/1994 | Martinez et al. | |
| 5,295,297 A | 3/1994 | Kitamura et al. | |
| 5,300,208 A | 4/1994 | Angelopoulos et al. | |
| 5,317,801 A | 6/1994 | Tanaka et al. | |
| 5,340,641 A | 8/1994 | Xu | |
| 5,347,258 A | 9/1994 | Howard et al. | |
| 5,354,712 A | 10/1994 | Ho et al. | |
| 5,367,764 A | 11/1994 | DiStefano et al. | |
| 5,378,858 A | 1/1995 | Bruckner et al. | |
| 5,380,679 A | 1/1995 | Kano | |
| 5,393,597 A | 2/1995 | Childers et al. | |
| 5,403,208 A | 4/1995 | Felcman et al. | |
| 5,404,637 A | 4/1995 | Kawakami | |
| 5,413,694 A | 5/1995 | Dixon et al. | |
| 5,416,662 A | 5/1995 | Kurasawa et al. | |
| 5,440,075 A | 8/1995 | Kawakita et al. | |
| 5,444,593 A | 8/1995 | Allina | |
| 5,476,471 A | 12/1995 | Shifrin et al. | |
| 5,481,795 A | 1/1996 | Hatakeyama et al. | |
| 5,483,407 A | 1/1996 | Anastasio et al. | |
| 5,487,218 A | 1/1996 | Bhatt et al. | |
| 5,493,146 A | 2/1996 | Pramanik et al. | |
| 5,501,350 A | 3/1996 | Yoshida et al. | |
| 5,502,889 A | 4/1996 | Casson et al. | |
| 5,510,629 A | 4/1996 | Karpovich et al. | |
| 5,550,400 A | 8/1996 | Takagi et al. | |
| 5,557,136 A | 9/1996 | Gordon et al. | |
| 5,654,564 A | 8/1997 | Mohsen | |
| 5,669,381 A | 9/1997 | Hyatt | |
| 5,685,070 A | 11/1997 | Alpaugh et al. | |
| 5,708,298 A | 1/1998 | Masayuki et al. | |
| 5,714,794 A | 2/1998 | Tsuyama et al. | |
| 5,734,188 A | 3/1998 | Murata et al. | |
| 5,744,759 A | 4/1998 | Ameen et al. | |
| 5,781,395 A | 7/1998 | Hyatt | |
| 5,802,714 A | 9/1998 | Kobayashi et al. | |
| 5,807,509 A | 9/1998 | Shrier et al. | |
| 5,808,351 A | 9/1998 | Nathan et al. | |
| 5,834,160 A | 11/1998 | Ferry et al. | |
| 5,834,824 A | 11/1998 | Shepherd et al. | |
| 5,834,893 A | 11/1998 | Bulovic et al. | |
| 5,848,467 A | 12/1998 | Khandros et al. | |
| 5,856,910 A | 1/1999 | Yurchenko et al. | |
| 5,865,934 A | 2/1999 | Yamamoto et al. | |
| 5,869,869 A | 2/1999 | Hively | |
| 5,874,902 A | 2/1999 | Heinrich et al. | |
| 5,906,042 A | 5/1999 | Lan et al. | |
| 5,910,685 A | 6/1999 | Watanabe et al. | |
| 5,926,951 A | 7/1999 | Khandros et al. | |
| 5,940,683 A | 8/1999 | Holm et al. | |
| 5,946,555 A | 8/1999 | Crumly et al. | |
| 5,955,762 A | 9/1999 | Hivley | |
| 5,956,612 A | 9/1999 | Elliott et al. | |
| 5,962,815 A | 10/1999 | Lan et al. | |
| 5,970,321 A | 10/1999 | Hively | |
| 5,972,192 A | 10/1999 | Dubin et al. | |
| 5,977,489 A | 11/1999 | Crotzer et al. | |
| 6,013,358 A | 1/2000 | Winnett et al. | |
| 6,023,028 A | 2/2000 | Neuhalfen | |
| 6,064,094 A | 5/2000 | Intrater et al. | |
| 6,108,184 A | 8/2000 | Minervini et al. | |
| 6,114,672 A | 9/2000 | Iwasaki et al. | |
| 6,130,459 A | 10/2000 | Intrater | |
| 6,146,552 A | 11/2000 | Iga et al. | |
| 6,160,695 A | 12/2000 | Winnett et al. | |
| 6,172,590 B1 | 1/2001 | Shrier et al. | |
| 6,184,280 B1 | 2/2001 | Shituba | |
| 6,191,928 B1 | 2/2001 | Rector et al. | |
| 6,198,392 B1 | 3/2001 | Hahn et al. | |
| 6,211,554 B1 | 4/2001 | Whitney et al. | |
| 6,228,904 B1 | 5/2001 | Yadav et al. | |
| 6,239,687 B1 | 5/2001 | Shrier et al. | |
| 6,250,984 B1 | 6/2001 | Jin et al. | |
| 6,251,513 B1 | 6/2001 | Rector et al. | |
| 6,310,752 B1 | 10/2001 | Shrier et al. | |
| 6,316,734 B1 | 11/2001 | Yang | |
| 6,340,789 B1 | 1/2002 | Petritsch et al. | |
| 6,351,011 B1 | 2/2002 | Whitney et al. | |
| 6,373,719 B1 | 4/2002 | Behling et al. | |
| 6,407,411 B1 | 6/2002 | Wojnarowski et al. | |
| 6,433,394 B1 | 8/2002 | Intrater | |
| 6,448,900 B1 | 9/2002 | Chen | |
| 6,455,916 B1 | 9/2002 | Robinson | |
| 6,468,593 B1 | 10/2002 | Iizawa et al. | |
| 6,512,458 B1 | 1/2003 | Kobayashi et al. | |
| 6,534,422 B1 | 3/2003 | Ichikawa et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,593,597 B2 | 7/2003 | Sheu | |
| 6,628,498 B2 | 9/2003 | Whitney et al. | |
| 6,642,297 B1 | 11/2003 | Hyatt et al. | |
| 6,657,532 B1 | 12/2003 | Shrier et al. | |
| 6,693,508 B2 | 2/2004 | Whitney et al. | |

(56) References Cited

U.S. PATENT DOCUMENTS

| | | | |
|---|---|---|---|
| 6,741,217 B2 | 5/2004 | Toncich et al. |
| 6,762,237 B2 | 7/2004 | Glatkowski et al. |
| 6,797,145 B2 | 9/2004 | Kosowsky |
| 6,882,051 B2 | 4/2005 | Majumdar et al. |
| 6,911,676 B2 | 6/2005 | Yoo |
| 6,916,872 B2 | 7/2005 | Yadav et al. |
| 6,981,319 B2 | 1/2006 | Shrier |
| 7,031,132 B1 | 4/2006 | Mitchell |
| 7,034,652 B2 | 4/2006 | Whitney et al. |
| 7,049,926 B2 | 5/2006 | Shrier et al. |
| 7,053,468 B2 | 5/2006 | Lee |
| 7,064,353 B2 | 6/2006 | Bhat |
| 7,132,697 B2 | 11/2006 | Weimer et al. |
| 7,132,922 B2 | 11/2006 | Harris et al. |
| 7,141,184 B2 | 11/2006 | Chacko et al. |
| 7,173,288 B2 | 2/2007 | Lee et al. |
| 7,183,891 B2 | 2/2007 | Harris et al. |
| 7,202,770 B2 | 4/2007 | Harris et al. |
| 7,205,613 B2 | 4/2007 | Fjelstad et al. |
| 7,218,492 B2 | 5/2007 | Shrier |
| 7,274,910 B2 | 9/2007 | Gilbert et al. |
| 7,320,762 B2 | 1/2008 | Greuter et al. |
| 7,408,203 B2 | 8/2008 | Kim et al. |
| 7,417,194 B2 | 8/2008 | Shrier |
| 7,446,030 B2 | 11/2008 | Kosowsky |
| 7,505,239 B2 | 3/2009 | Kanazawa et al. |
| 7,528,467 B2 | 5/2009 | Lee |
| 7,593,203 B2 | 9/2009 | Dudnikov et al. |
| 7,626,198 B2 | 12/2009 | Hirakata et al. |
| 7,688,598 B2 | 3/2010 | Dudnikov et al. |
| 7,872,251 B2 * | 1/2011 | Kosowsky et al. ............... 257/3 |
| 7,998,370 B2 * | 8/2011 | Hama et al. .................. 252/513 |
| 2001/0043141 A1 | 11/2001 | Tuttle |
| 2002/0004258 A1 | 1/2002 | Nakayama et al. |
| 2002/0061363 A1 | 5/2002 | Halas et al. |
| 2003/0008123 A1 | 1/2003 | Glatkowski et al. |
| 2003/0008989 A1 | 1/2003 | Gore et al. |
| 2003/0010960 A1 | 1/2003 | Greuter et al. |
| 2003/0078332 A1* | 4/2003 | Dardi ........................... 524/439 |
| 2003/0079910 A1 | 5/2003 | Kosowsky |
| 2003/0151029 A1 | 8/2003 | Hsu et al. |
| 2003/0160570 A1 | 8/2003 | Sasaki et al. |
| 2003/0207978 A1 | 11/2003 | Yadav et al. |
| 2003/0218851 A1 | 11/2003 | Harris et al. |
| 2003/0221966 A1 | 12/2003 | Bonkass et al. |
| 2004/0062041 A1 | 4/2004 | Cross et al. |
| 2004/0063294 A1 | 4/2004 | Durocher et al. |
| 2004/0063839 A1 | 4/2004 | Kawate et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0178713 A1 | 9/2004 | Na et al. |
| 2004/0211942 A1 | 10/2004 | Clark et al. |
| 2004/0241894 A1 | 12/2004 | Nagai et al. |
| 2004/0262583 A1* | 12/2004 | Lee .............................. 252/500 |
| 2005/0026334 A1 | 2/2005 | Knall |
| 2005/0057867 A1* | 3/2005 | Harris et al. ..................... 361/56 |
| 2005/0083163 A1 | 4/2005 | Shrier |
| 2005/0106098 A1 | 5/2005 | Tsang et al. |
| 2005/0121653 A1 | 6/2005 | Chacko |
| 2005/0184387 A1 | 8/2005 | Collins et al. |
| 2005/0208304 A1 | 9/2005 | Collier et al. |
| 2005/0218380 A1 | 10/2005 | Gramespacher et al. |
| 2005/0231091 A1 | 10/2005 | Bouchard et al. |
| 2005/0274455 A1 | 12/2005 | Extrand |
| 2005/0274956 A1 | 12/2005 | Bhat |
| 2005/0275070 A1 | 12/2005 | Hollingsworth |
| 2006/0035081 A1 | 2/2006 | Morita et al. |
| 2006/0060880 A1 | 3/2006 | Lee et al. |
| 2006/0142455 A1 | 6/2006 | Agarwal et al. |
| 2006/0152334 A1 | 7/2006 | Maercklein et al. |
| 2006/0154070 A1 | 7/2006 | Wakiya et al. |
| 2006/0166474 A1 | 7/2006 | Vereecken et al. |
| 2006/0167139 A1 | 7/2006 | Nelson et al. |
| 2006/0181826 A1 | 8/2006 | Dudnikov, Jr. et al. |
| 2006/0181827 A1 | 8/2006 | Dudnikov, Jr. et al. |
| 2006/0193093 A1 | 8/2006 | Bertin et al. |
| 2006/0199390 A1 | 9/2006 | Dudnikov, Jr. et al. |
| 2006/0211837 A1 | 9/2006 | Ko et al. |
| 2006/0214156 A1 | 9/2006 | Pan et al. |
| 2006/0234127 A1 | 10/2006 | Kim et al. |
| 2006/0291127 A1 | 12/2006 | Kim et al. |
| 2006/0293434 A1 | 12/2006 | Yodh et al. |
| 2007/0114640 A1 | 5/2007 | Kosowsky |
| 2007/0116976 A1 | 5/2007 | Tan et al. |
| 2007/0123625 A1 | 5/2007 | Dorade et al. |
| 2007/0126018 A1 | 6/2007 | Kosowsky |
| 2007/0139848 A1 | 6/2007 | Harris et al. |
| 2007/0146941 A1 | 6/2007 | Harris et al. |
| 2007/0208243 A1 | 9/2007 | Gabriel et al. |
| 2008/0023675 A1 | 1/2008 | Kosowsky |
| 2008/0029405 A1 | 2/2008 | Kosowsky |
| 2008/0032049 A1 | 2/2008 | Kosowsky |
| 2008/0035370 A1 | 2/2008 | Kosowsky |
| 2008/0045770 A1 | 2/2008 | Sigmund et al. |
| 2008/0050856 A1 | 2/2008 | Chu et al. |
| 2008/0073114 A1 | 3/2008 | Kosowsky |
| 2008/0299298 A1* | 12/2008 | Kim et al. ........................ 427/77 |
| 2008/0313576 A1 | 12/2008 | Kosowsky |
| 2009/0044970 A1 | 2/2009 | Kosowsky |
| 2009/0050856 A1 | 2/2009 | Kosowsky |
| 2009/0071368 A1* | 3/2009 | Steingrover et al. ............ 106/35 |
| 2009/0114425 A1* | 5/2009 | Lee et al. ....................... 174/250 |
| 2009/0117021 A1 | 5/2009 | Smith et al. |
| 2009/0212266 A1 | 8/2009 | Kosowsky |
| 2009/0220771 A1 | 9/2009 | Kosowsky |
| 2009/0242855 A1 | 10/2009 | Kosowsky |
| 2009/0256669 A1 | 10/2009 | Kosowsky |
| 2010/0047535 A1 | 2/2010 | Kosowsky et al. |
| 2010/0222462 A1* | 9/2010 | Yamauchi et al. ............... 524/35 |
| 2010/0243302 A1 | 9/2010 | Kosowsky et al. |
| 2010/0263200 A1 | 10/2010 | Kosowsky |
| 2010/0264224 A1 | 10/2010 | Kosowsky |
| 2010/0264225 A1 | 10/2010 | Kosowsky |
| 2010/0270545 A1 | 10/2010 | Kosowsky |
| 2010/0270546 A1 | 10/2010 | Kosowsky |
| 2010/0271831 A1 | 10/2010 | Kosowsky et al. |
| 2010/0281453 A1 | 11/2010 | Kosowsky et al. |
| 2010/0281454 A1 | 11/2010 | Kosowsky et al. |
| 2011/0058291 A1 | 3/2011 | Kosowsky et al. |
| 2011/0132645 A1 | 6/2011 | Shi et al. |
| 2011/0234363 A1 | 9/2011 | Kosowsky et al. |

FOREIGN PATENT DOCUMENTS

| | | |
|---|---|---|
| CN | 101578710 A | 11/2009 |
| DE | 3040784 A1 | 5/1982 |
| DE | 10115333 A1 | 1/2002 |
| DE | 102004049053 A1 | 5/2005 |
| DE | 102006047377 A1 | 4/2008 |
| EP | 790 758 A1 | 8/1997 |
| EP | 1 003 229 A1 | 5/2000 |
| EP | 1 245 586 A2 | 10/2002 |
| EP | 1 580 809 A2 | 9/2005 |
| EP | 1 542 240 A2 | 6/2006 |
| EP | 1 857 871 A1 | 4/2007 |
| EP | 1 990 834 A2 | 11/2008 |
| JP | 56091464 A | 7/1981 |
| JP | 60-091489 A | 5/1985 |
| JP | 62-137807 A | 6/1987 |
| JP | 63 195275 A | 8/1988 |
| JP | 63-196672 A | 8/1988 |
| JP | 11-067966 A | 3/1999 |
| JP | 11-345292 A | 12/1999 |
| JP | 2000 062076 A | 2/2000 |
| JP | 2000-067646 A | 3/2000 |
| JP | 2002-353003 A | 12/2002 |
| JP | 2003-163104 A | 6/2003 |
| JP | 2003-288567 A | 10/2003 |
| JP | 2003-346108 A | 12/2003 |
| JP | 2004-014466 A | 1/2004 |
| JP | 2005-224953 A | 8/2005 |
| WO | WO 88/00526 A1 | 1/1988 |
| WO | WO 89/06859 A2 | 7/1989 |

(56) References Cited

FOREIGN PATENT DOCUMENTS

| WO | WO 96/02922 A2 | 2/1996 |
|---|---|---|
| WO | WO 96/02924 A1 | 2/1996 |
| WO | WO 96/02944 A1 | 2/1996 |
| WO | WO 97/26665 A1 | 7/1997 |
| WO | WO 98/23018 A1 | 5/1998 |
| WO | WO 99/24992 A1 | 5/1999 |
| WO | WO 99/49525 A1 | 9/1999 |
| WO | WO 02/103085 A1 | 12/2002 |
| WO | WO 03/057359 A2 | 7/2003 |
| WO | WO 2005/100426 A1 | 10/2005 |
| WO | WO 2006/130366 A2 | 12/2006 |
| WO | WO 2007/062170 A2 | 5/2007 |
| WO | WO 2007/062171 A2 | 5/2007 |
| WO | WO 2008/016858 A1 | 2/2008 |
| WO | WO 2008/016859 A1 | 2/2008 |
| WO | WO 2008/024207 A1 | 2/2008 |
| WO | WO 2008/036984 A2 | 3/2008 |
| WO | WO 2008/153584 A1 | 12/2008 |
| WO | WO 2009/026299 A1 | 2/2009 |
| WO | WO 2010/039902 A2 | 4/2010 |

OTHER PUBLICATIONS

U.S. Appl. No. 12/714,354, filed Feb. 26, 2010, Fleming et al.
U.S. Appl. No. 12/714,358, filed Feb. 26, 2010, Fleming et al.
U.S. Appl. No. 12/717,102, filed Mar. 3, 2010, Kosowsky et al.
U.S. Appl. No. 12/731,557, filed Mar. 25, 2010, Kosowsky.
Fullerene Chemistry—Wikipedia, http://en.wikipedia.org/wiki/Fullerene/chemistry, 6 pages, printed Apr. 8, 2010.
International Preliminary Report on Patentability for International Application PCT/US2008/073603 mailed Mar. 4, 2010, 7 pages.
International Search Report, Written Opinion and Notice of Transmittal of Same mailed Apr. 16, 2010 for International Application PCT/US2009/062844 20 pages.
International Search Report, Written Opinion and Notice of Transmittal of Same mailed Apr. 20, 2010 for International Application PCT/US2009/059134 22 pages.
International Search Report, Written Opinion, and Notice of Transmittal of same mailed Mar. 18, 2010 for International Application PCT/US2010/021889 15 pages.
Non-Final Office Action mailed Apr. 20, 2010 in U.S. Appl. No. 11/829,946, 20 pages.
Non-Final Office Action dated Apr. 13, 2010 in U.S. Appl. No. 12/714,358, 17 pages.
Non-Final Office Action dated Apr. 13, 2010 in U.S. Appl. No. 12/714,354, 17 pages.
U.S. Appl. No. 11/562,222, filed Nov. 21, 2006, Kosowsky.
U.S. Appl. No. 12/356,490, filed Jan. 20, 2009, Kosowsky.
U.S. Appl. No. 12/370,589, filed Feb. 12, 2009, Kosowsky.
U.S. Appl. No. 12/561,195, filed Sep. 16, 2009, Kosowsky et al.
U.S. Appl. No. 12/571,318, filed Sep. 30, 2009, Kosowsky et al.
U.S. Appl. No. 12/607,952, filed Oct. 28, 2009, Fleming et al.
U.S. Appl. No. 12/638,632, filed Dec. 15, 2009, Fleming et al.
U.S. Appl. No. 12/642,799, filed Dec. 19, 2009, Fleming et al.
U.S. Appl. No. 12/692,573, filed Jan. 22, 2010, Fleming et al.
U.S. Appl. No. 12/703,674, filed Feb. 10, 2010, Kosowsky et al.
U.S. Appl. No. 12/703,701, filed Feb. 10, 2010, Kosowsky et al.
U.S. Appl. No. 12/703,723, filed Feb. 10, 2010, Kosowsky et al.
Breton et al., "Mechanical properties of multiwall carbon nanotubes/epoxy composites: influence of network morphology," Carbon Elsevier UK, vol. 42, No. 5-6, pp. 1027-1030 (2004).
Celzard, A., et al., "Conduction Mechanisms in Some Graphite-polymer Composites: The Effect of a Direct-current Electric Field", Journal of Physics: Condensed Matter, 9 (1997) pp. 2225-2237.
Communication of Nov. 23, 2009 with Supp European Search Report and Opinion, European Application No. 06 838 319.9 7 pages.
Communication of Nov. 11, 2009 with Examination Report in European Patent Application No. 07 813 509.2 5 pages.
Communication pf Nov. 9, 2009 with Examination Report in European Patent Application No. 07 813 508.4, 5 pages.
Communication with Examination Report mailed Dec. 23, 2009 in European app. 06838276.1-2203, 6 pgs.
Facchetti, Antonio, "Semiconductors for Organic Transistors", Materials Today, vol. 10, No. 3, pp. 28-37.
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
International Preliminary Report on Patentability in International Application PCT/US2007/074677, Feb. 3, 2009, 8 pages.
International Preliminary Report on Patentability for International Application PCT/US06/045291, ISA/US, mailed Mar. 24, 2009, 8 pages.
International Preliminary Report on Patentability for International Application PCT/US07/079377 mailed Dec. 30, 2009, 8 pages.
International Search Report and Written Opinion in International Application PCT/US2007/079345, mailed Nov. 7, 2008, 25 pages.
International Search Report and Written Opinion of the International Searching Authority in International Application PCT/US2007/074677, European Patent Office, Dec. 5, 2007, 13 pages.
International Search Report and Written Opinion of the International Searching Authority in International Application PCT/US2008/073603, US Patent Office, Nov. 17, 2008, 7 pages.
International Search Report and Written Opinion in International Application PCT/US2009/038429 mailed Aug. 18, 2009, 20 pgs.
International Search Report and Written Opinion of the International Searching Authority in International Application PCT/US2007/079377, European Patent Office, Mar. 7, 2008, 13 pages.
International Search Report and Written Opinion of the International Searching Authority in International Application PCT/US06/45291, United States Patent Office, Mar. 5, 2008, 14 pages.
International Search Report and Written Opinion of the International Searching Authority in International Application PCT/US09/040384, European Patent Office, Jul. 2, 2009, 15 pages.
International Search Report and Written Opinion mailed Nov. 12, 2009 in International Application PCT/US2009/054062, 15 pages.
International Search Report and Written Opinion mailed Nov. 17, 2009 in International Application PCT/US2009/057209, 14 pages.
International Search Report and Written Opinion of the International Searching Authority in International Application PCT/US06/45292, United States Patent Office, Feb. 14, 2008, 10 pages.
Levinson et al., "The Physics of metal oxide varistors," J. Applied Physics, 46(3): 1332-1341 (1975).
Modine, F.A. and Hyatt, H.M. "New Varistor Material", Journal of Applied Physics, 64 (8), Oct. 15, 1988, pp. 4229-4232.
Notice of Allowance Jan. 14, 2010 U.S. Appl. No. 11/562,289 9pages.
Onoda et al., "Photoinduced Charge Transfer of Conducting Polymer Compositions," IEICE Trans. Electronics, vol. E81-C(7), pp. 1051-1056 (1998).
Raffaelle et al., "Nanomaterial Development for Polymeric Solar Cells," IEEE 4th World Conf on Photovoltaic energy Conversion, pp. 186-189 (2006).
Reese, Colin and Bao, Zhenan, "Organic Single-Crystal Field-Effect Transistors", Materials Today, vol. 10, No. 3, pp. 20-27.
Saunders et al., "Nanoparticle-polymer photovoltaic cells," Adv. Colloid Int. Sci., vol. 138, No. 1, pp. 1-23 (2007).
Advisory Action mailed Jun. 13, 2007 in U.S. Appl. No. 10/180,078.
Examination Report for European Application 06838319.9 mailed May 7, 2010.
Examination Report for European Application 07813509.2-1218 mailed Jul. 2, 2010.
Examination Report for European Application 07813508.4-1218 mailed Jul. 2, 2010.
Examination Report of Jun. 30, 2011 in Malaysian Application No. PI 20081699.
Examination Report of May 24, 2011 in European Application 09724188.9.
Examination Report of Jan. 21, 2011 in European Application No. 07813509.2.
Examination Report of Jul. 27, 2011 in EP application 09791586.2.
Examination Report of Jan. 21, 2011 in European Application No. 07813508.4.

(56) References Cited

OTHER PUBLICATIONS

Extended European Search Report for European Application 10158080.1 mailed Jul. 1, 2010.
Final Office Action mailed Aug. 11, 2011 in U.S. Appl. No. 11/829,951.
Final Office Action mailed Aug. 1, 2011 in U.S. Appl. No. 11/860,522.
Final Office Action mailed Aug. 11, 2011 in U.S. Appl. No. 12/832,022.
Final Office Action mailed Apr. 13, 2011 in U.S. Appl. No. 11/829,948.
Final Office Action mailed Jul. 1, 2011 in U.S. Appl. No. 12/571,318.
Final Office Action mailed Apr. 8, 2011 in U.S. Appl. No. 12/820,939.
Final Office Action mailed Aug. 11, 2011 in U.S. Appl. No. 12/832,033.
Final Office Action mailed May 5, 2011 in U.S. Appl. No. 12/193,603.
Final Office Action mailed Feb. 23, 2011 in U.S. Appl. No. 12/714,354.
Final Office Action mailed Mar. 3, 2011 in U.S. Appl. No. 11/562,222.
Final Office Action mailed Oct. 13, 2010 in U.S. Appl. No. 11/829,946.
Final Office Action mailed Oct. 13, 2010 in U.S. Appl. No. 12/714,358.
International Preliminary Report on Patentability mailed Oct. 28, 2010 in PCT/US2009/040384.
International Preliminary Report on Patentability mailed Oct. 7, 2010 in PCT/US2009/038429.
International Preliminary Report on Patentability of Aug. 4, 2011 in International App. No. PCT/US2010/021889.
Invitation to Pay Additional Fees with partial Search Report for International Application PCT/US2010/058435 mailed Feb. 25, 2011.
Non-Final Office Action mailed Oct. 6, 2010 in U.S. Appl. No. 12/714,354.
Non-Final Office Action mailed Sep. 27, 2010 in U.S. Appl. No. 11/829,948.
Non-Final Office Action mailed Jan. 13, 2011 in U.S. Appl. No. 12/832,033.
Non-Final Office Action mailed Jan. 20, 2011 in U.S. Appl. No. 11/829,951.
Non-Final Office Action mailed Dec. 1, 2010 in U.S. Appl. No. 12/193,603.
Non-Final Office Action mailed Oct. 14, 2010 in U.S. Appl. No. 12/356,490.
Non-Final Office Action mailed Jan. 13, 2011 in U.S. Appl. No. 12/832,022.
Non-Final Office Action mailed Oct. 7, 2010 in U.S. Appl. No. 12/832,040.
Non-Final Office Action mailed Dec. 21, 2010 in U.S. Appl. No. 11/860,522.
Non-Final Office Action mailed Sep. 28, 2010 in U.S. Appl. No. 12/703,674.
Non-Final Office Action mailed Nov. 10, 2010 in U.S. Appl. No. 12/571,318.
Non-Final Office Action mailed Sep. 13, 2011 in U.S. Appl. No. 12/714,358.
Non-Final Office Action mailed Sep. 28, 2010 in U.S. Appl. No. 12/703,701.
Non-Final Office Action mailed Sep. 27, 2010 in U.S. Appl. No. 12/703,723.
Non-Final Office Action mailed Jul. 20, 2010 in U.S. Appl. No. 11/562,222.
Non-Final Office Action mailed Sep. 2, 2011 in U.S. Appl. No. 12/714,354.
Non-Final Office Action mailed Jul. 20, 2011 in U.S. Appl. No. 12/417,589.
Non-Final Office Action mailed Jul. 11, 2011 in U.S. Appl. No. 12/407,347.
Non-Final Office Action mailed Aug. 15, 2011 in U.S. Appl. No. 12/356,490.
Non-Final Office Action mailed Oct. 22, 2010 in U.S. Appl. No. 12/820,939.
Non-Final Office Action mailed Aug. 29, 2011 in U.S. Appl. No. 11/829,946.
Non-Final Office Action mailed Aug. 8, 2011 in U.S. Appl. No. 11/562,222.
Non-Final Office Action mailed Oct. 11, 2011 in U.S. Appl. No. 12/820,939.
Notice of Allowance mailed Apr. 28, 2011 in U.S. Appl. No. 12/703,674.
Notice of Allowance mailed Sep. 7, 2010 in U.S. Appl. No. 11/562,289.
Notice of Allowance mailed Apr. 14, 2011 in U.S. Appl. No. 12/832,040.
Notice of Allowance mailed Mar. 18, 2011 in U.S. Appl. No. 12/703,723.
Notice of Allowance mailed Jun. 21, 2010 in U.S. Appl. No. 11/860,530.
Notice of Allowance mailed May 6, 2011 in U.S. Appl. No. 12/703,701.
Office Action Issued Jul. 29, 2010 in Chinese Application No. 200780028607.9.
Request for Reconsideration after Final Rejection filed May 15, 2007 in U.S. Appl. No. 10/180,078.
Response to Final Office Action filed Jan. 9, 2006 in U.S. Appl. No. 10/180,078.
Supplemental European Search Report of Aug. 26, 2011 in EP 08798195.5.
Translation of Office Actopm of Aug. 10, 2011 in Chinese Application No. 200780028617.2.
Translation of Office Action of Aug. 24, 2011 in Chinese App. No. 200780053354.0.
Translation of Office Action of Sep. 6, 2011 in Japanese App. No. 2009-522984.
Translation of Office Action of Jul. 12, 2010 in Chinese Application 200780028617.2.
Translation of Office Action of Sep. 6, 2011 in Japanese App. No. 2009-522983.
Translation of Office Action of Jun. 28, 2011 in Japanese App. No. 2008-542453.
Translation of Office Action of Jul. 7, 2010 in Chinese Application 200680043524.2.
Translation of Office Action of Jun. 14, 2011 in Japanese App. No. 2008-542454.
Translation of Office Action of Mar. 24, 2011 in Chinese Application No. 200680043467.8.
Translation of Office Action of Jan. 26, 2011 in Chinese Application No. 200780028617.2.
Translation of Office Action of Oct. 26, 2010 in Chinese App. No. 200780035255.X.
Translation of Office Action of Aug. 3, 2011 in Chinese App. No. 200780035255.X.
Translation of Office Action of Jan. 26, 2011 in Chinese Application No. 200780028607.9.
U.S. Appl. No. 13/359,410, filed Jan. 26, 2012, Fleming et al.
Non-Final Office Action mailed Feb. 23, 2012 in U.S. Appl. No. 12/820,956.
Notice of Allowance mailed Feb. 2, 2012 in U.S. Appl. No. 12/417,589.
Notice of Allowance mailed Jan. 27, 2012 in U.S. Appl. No. 12/356,490.
Office Action of Jan. 31, 2012 in Korean Patent Application 2010-7023158.
U.S. Appl. No. 13/291,090, filed Nov. 7, 2011, Vasquez et al.
International Preliminary Report on Patentability of May 19, 2011 in International App. No. PCT/US2009/062844.
International Search Report, Written Opinion, Notice of Transmittal of same mailed Oct. 28, 2011 in PCT/US2010/060617.
Non-Final Office Action mailed Dec. 30, 2011 in U.S. Appl. No. 12/561,195.
Office Action Issued Nov. 2, 2011 in Chinese Application No. 200680043524.2.
Translation of Office Action of Oct. 31, 2011 in Chinese App. No. 20098010307.0.

* cited by examiner

VOLTAGE SWITCHABLE DIELECTRIC MATERIAL CONTAINING CONDUCTOR-ON-CONDUCTOR CORE SHELLED PARTICLES

RELATED APPLICATIONS

This application is a continuation-in-part of U.S. patent application Ser. No. 12/571,318, filed Sep. 30, 2009; which claims benefit of priority to Provisional U.S. Patent Application No. 61/101,637; Sep. 30, 2008 both of the aforementioned priority applications being hereby incorporated by reference in their respective entirety.

TECHNICAL FIELD

Embodiments described herein pertain generally to voltage switchable dielectric material, and more specifically to voltage switchable dielectric composite materials containing core shelled compounds.

BACKGROUND

Voltage switchable dielectric (VSD) materials are materials that are insulative at low voltages and conductive at higher voltages. These materials are typically composites comprising of conductive, semiconductive, and insulative particles in an insulative polymer matrix. These materials are used for transient protection of electronic devices, most notably electrostatic discharge protection (ESD) and electrical overstress (EOS). Generally, VSD material behaves as a dielectric, unless a characteristic voltage or voltage range is applied, in which case it behaves as a conductor. Various kinds of VSD material exist. Examples of voltage switchable dielectric materials are provided in references such as U.S. Pat. No. 4,977,357, U.S. Pat. No. 5,068,634, U.S. Pat. No. 5,099,380, U.S. Pat. No. 5,142,263, U.S. Pat. No. 5,189,387, U.S. Pat. No. 5,248,517, U.S. Pat. No. 5,807,509, WO 96/02924, and WO 97/26665, all of which are incorporated by reference herein.

VSD materials may be formed in using various processes. One conventional technique provides that a layer of polymer is filled with high levels of metal particles to very near the percolation threshold, typically more than 25% by volume. Semiconductor and/or insulator materials is then added to the mixture.

Another conventional technique provides for forming VSD material by mixing doped metal oxide powders, then sintering the powders to make particles with grain boundaries, and then adding the particles to a polymer matrix to above the percolation threshold.

Other techniques for forming VSD material are described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES.

DETAILED DESCRIPTION

Embodiments described herein provide a composition of voltage switchable dielectric (VSD) material that comprises conductive core shelled particles. According to embodiments, VSD material is formulated having particle constituents that individually include a conductive core and one or more shell layers. In some embodiments, the VSD material includes multiple shell layers for corresponding conductive core centers.

In some embodiments, VSD material is comprised of conductor-on-conductor core shelled particles. These particles include cores that are formed from, for example, metals such as copper, silver, nickel, gold, or aluminum. The core is surrounded by one or more layers of shell material. The exterior or exposed shell layer (if more than one shell layer exists) is also comprised of metal, such as nickel, silver, gold or copper.

Still further, an embodiment provides for a composition of voltage switchable dielectric (VSD) material that includes a concentration of core shelled particles that individually comprise a conductor core and a shell, with the shell of each core shelled particle being (i) multilayered, and/or (ii) heterogeneous.

Still further, some embodiments include a composition that includes a binder having multiple types particle constituents uniformly mixed therein. The multiple types of particle constituents include a concentration of conductor and/or semiconductor particle constituents, and a concentration of particles that include conductive core shelled particles. In particular, the core shelled particles may be conductive, core mufti-layered shell (CCMLS) particles. As an addition or alternative, the core shelled particles may be comprised of a heterogeneous shell. The resulting VSD composition is (i) dielectric in absence of a voltage that exceeds a characteristic voltage level, and (ii) conductive with application of a voltage that exceeds a characteristic voltage level of the composition.

Overview of VSD Material

As used herein, "voltage switchable material" or "VSD material" is any composition, or combination of compositions, that has a characteristic of being dielectric or non-conductive, unless a field or voltage is applied to the material that exceeds a characteristic level of the material, in which case the material becomes conductive. Thus, VSD material is a dielectric unless voltage (or field) exceeding the characteristic level (e.g. such as provided by ESD events) is applied to the material, in which case the VSD material is switched into a conductive state. VSD material can further be characterized as a nonlinear resistance material. With an embodiment such as described, the characteristic voltage may range in values that exceed the operational voltage levels of the circuit or device several times over. Such voltage levels may be of the order of transient conditions, such as produced by electrostatic discharge, although embodiments may include use of planned electrical events. Furthermore, one or more embodiments provide that in the absence of the voltage exceeding the characteristic voltage, the material behaves similar to the binder.

Still further, an embodiment provides that VSD material may be characterized as material comprising a binder mixed in part with conductor or semi-conductor particles. In the absence of voltage exceeding a characteristic voltage level, the material as a whole adapts the dielectric characteristic of the binder. With application of voltage exceeding the characteristic level, the material as a whole adapts conductive characteristics.

Many compositions of VSD material provide desired 'voltage switchable' electrical characteristics by dispersing a quantity of conductive materials in a polymer matrix to just below the percolation threshold, where the percolation threshold is defined statistically as the threshold by which a continuous conduction path is likely formed across a thickness of the material. Other materials, such as insulators or semiconductors, may be dispersed in the matrix to better control the percolation threshold. Still further, other compositions of VSD material, including some that include particle constituents such as core shell particles (as described herein) or other particles may load the particle constituency above the percolation threshold. As described by embodiments, the VSD material may be situated on an electrical device in order to protect a circuit or electrical component of device (or specific sub-region of the device) from electrical events, such as ESD or EOS. Accordingly, one or more embodiments provide that VSD material has a characteristic voltage level that exceeds that of an operating circuit or component of the device.

According to embodiments described herein, the constituents of VSD material may be uniformly mixed into a binder or polymer matrix. In one embodiment, the mixture is dispersed at nanoscale, meaning the particles that comprise the organic conductive/semi-conductive material are nano-scale in at least one dimension (e.g. cross-section) and a substantial number of the particles that comprise the overall dispersed quantity in the volume are individually separated (so as to not be agglomerated or compacted together).

Still further, an electronic device may be provided with VSD material in accordance with any of the embodiments described herein. Such electrical devices may include substrate devices, such as printed circuit boards, semiconductor packages, discrete devices, Light Emitting Diodes (LEDs), and radio-frequency (RF) components.

VSD Composite with Core Shelled Particles

In some applications, inherent issues may arise with the use of VSD composites that load particles to just below the percolation threshold. In particular, embodiments described herein recognize that some VSD compositions incorporate carbon nanotubes, conductive polymers, and other graphitic compounds. But in instances when these particles are loaded into a matrix of the composition to levels that are 'just below' percolation levels, the conductive nature of the particles can have higher than desired current leakage and/or very low loading levels. Other semiconductive particles or nanorods such as titanium dioxide, in oxide, or antimony doped in oxide are not as conductive and therefore can be loaded to high levels. However, these materials are not as conductive and therefore cannot conduct as much current in the "on state"; thereby not providing as much ESD protection. Hence, it is desirable to be able to "tune" the conductivity and band-gap of the polymer, particle, nanoparticle, and/or nanorods to optimize the balance between "on state" resistance and "off state" resistance, i.e. maximize off state resistance, and minimize on state resistance.

Embodiments described herein enable core shell particles to be comprised of core or shell material that has a desired electrical or physical characteristic. In this way, the core or shell material of the core shell particle is selected to form a core shell particle constituent of VSD material that tunes a desired electrical or physical characteristic of the overall composition of VSD material.

Still further, some embodiments described herein recognize that for many VSD composites, after a layer or quantity of the VSD material has been pulsed with a high voltage ESD event (or simulated version thereof), some current must flow through the polymer matrix between the conductive particles. As a result, degrading side reactions may arise, most likely due to the high electron flow and localized heating in the polymer.

Embodiments described herein include composites of VSD material that incorporate core shelled particles, such as CCMLS particles or core shelled particles that have heterogeneous shell layers. The inclusion of such core shelled particles enhances desired electrical characteristics from the VSD composition (e.g. reduction in leakage current).

Figure 1:
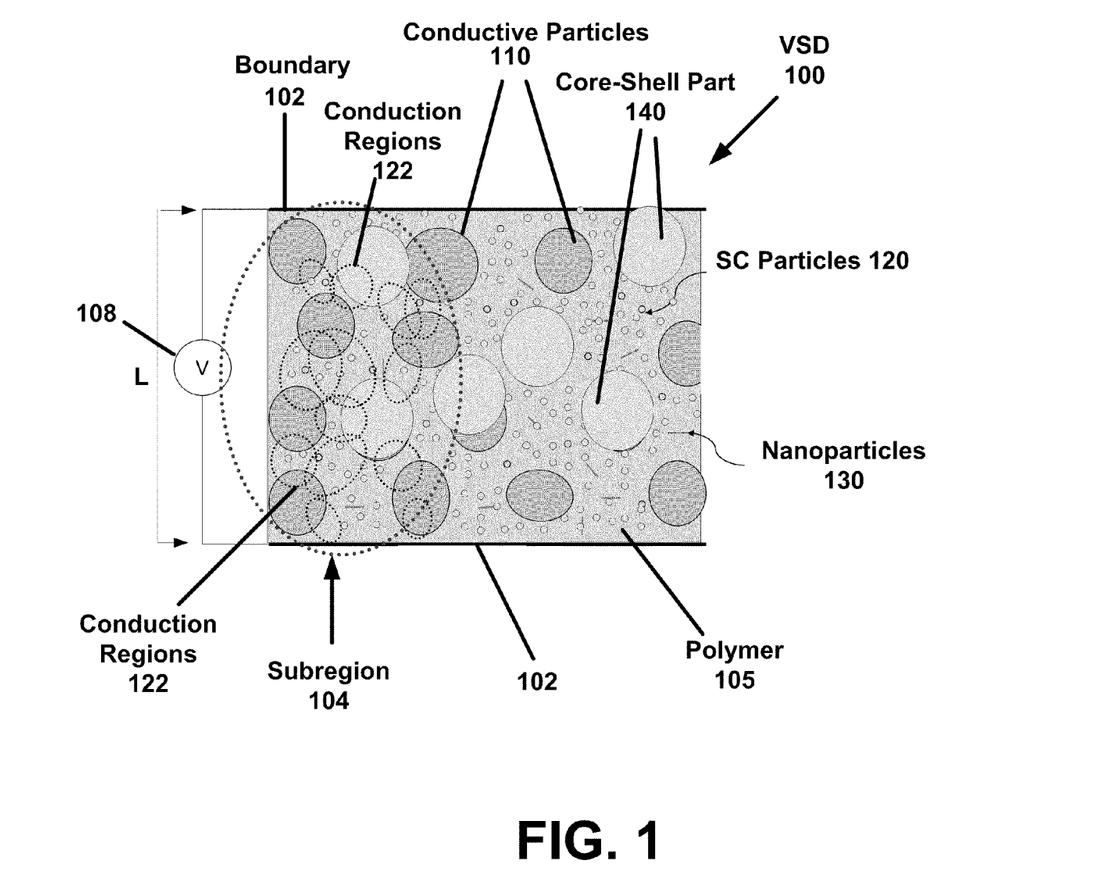
FIG. 1 is an illustrative sectional view of a layer or thickness of VSD material, depicting the constituents of VSD material in accordance with various embodiments.

FIG. 1 is an illustrative (not to scale) sectional view of a layer or thickness of VSD material, depicting the constituents of VSD material in accordance with various embodiments. As depicted, VSD material 100 includes matrix binder 105 and various types of particle constituents, dispersed in the binder in various concentrations. The particle constituents of the VSD material may include a combination of conductive particles 110, semiconductor particles 120, nano-dimensioned particles 130 and/or core shelled particles 140. In some implementations, the core shelled particles 140 may substitute for some or all of the conductive particles 110. As an alternative or variation, the VSD composition may omit the use of conductive particles 110, semiconductive particles 120, or nano-dimensioned particles 130, particularly with the presence of a concentration of core shelled particles 140. Thus, the type of particle constituent that are included in the VSD composition may vary, depending on the desired electrical and physical characteristics of the VSD material. For example, some VSD compositions may include conductive particles 110, but not semiconductive particles 120 and/or nano-dimensioned particles 130. Still further, other embodiments may omit use of conductive particles 110.

Examples for matrix binder 105 include polyethylenes, silicones, acrylates, polymides, polyurethanes, epoxies, polyamides, polycarbonates, polysulfones, polyketones, and copolymers, and/or blends thereof.

Examples of conductive materials 110 include metals such as copper, aluminum, nickel, silver, gold, titanium, stainless steel, nickel phosphorus, niobium, tungsten, chrome, other metal alloys, or conductive ceramics like titanium diboride or titanium nitride. Examples of semiconductive material 120 include both organic and inorganic semiconductors. Some inorganic semiconductors include, silicon carbide, Boron-nitride, aluminum nitride, nickel oxide, zinc oxide, zinc sulfide, bismuth oxide, titanium dioxide, cerium oxide, bismuth oxide, in oxide, indium in oxide, antimony in oxide, and iron oxide, praseodynium oxide. The specific formulation and composition may be selected for mechanical and electrical properties that best suit the particular application of the VSD material. The nano-dimensioned particles 130 may be of one or more types. Depending on the implementation, at least one constituent that comprises a portion of the nano-dimensioned particles 130 are (i) organic particles (e.g. carbon nanotubes, graphenes); or (ii) inorganic particles (metallic, metal oxide, nanorods, or nanowires). The nano-dimensioned particles may have high-aspect ratios (HAR), so as to have aspect ratios that exceed at least 10:1 (and may exceed 1000:1 or more). The particle constituents may be uniformly dispersed in the polymer matrix or binder at various concentrations. Specific examples of such particles include copper, nickel, gold, silver, cobalt, zinc oxide, in oxide, silicon carbide, gallium arsenide, aluminum oxide, aluminum nitride, titanium dioxide, antimony, Boron-nitride, in oxide, indium in oxide, indium zinc oxide, bismuth oxide, cerium oxide, and antimony zinc oxide.

The dispersion of the various classes of particles in the matrix 105 may be such that the VSD material 100 is non-layered and uniform in its composition, while exhibiting electrical characteristics of voltage switchable dielectric material. Generally, the characteristic voltage of VSD material is measured at volts/length (e.g. per 5 mil), although other field measurements may be used as an alternative to voltage. Accordingly, a voltage 108 applied across the boundaries 102 of the VSD material layer may switch the VSD material 100 into a conductive state if the voltage exceeds the characteristic voltage for the gap distance L.

As depicted by a sub-region 104 (which is intended to be representative of the VSD material 100), VSD material 100 comprises particle constituents that individually carry charge when voltage or field acts on the VSD composition. If the field/voltage is above the trigger threshold, sufficient charge is carried by at least some types of particles to switch at least a portion of the composition 100 into a conductive state. More specifically, as shown for representative sub-region 104, individual particles (of types such as conductor particles, core shell particles or other semiconductive or compound particles) acquire conduction regions 122 in the polymer binder 105 when a voltage or field is present. The voltage or field level at which the conduction regions 122 are sufficient in magnitude and quantity to result in current passing through a thickness of the VSD material 100 (e.g. between boundaries 102) coincides with the characteristic trigger voltage of the composition. FIG. 1 illustrates presence of conduction regions 122 in a portion of the overall thickness. The portion or thickness of the VSD material 100 provided between the boundaries 102 may be representative of the separation between lateral or vertically displaced electrodes. When voltage is present, some or all of the portion of VSD material can be affected to increase the magnitude or count of the conduction regions in that region. When voltage is applied, the presence of conduction regions may vary across the thickness (either vertical or lateral thickness) of the VSD composition, depending on, for example, the location and magnitude of the voltage of the event. For example, only a portion of the VSD material may pulse, depending on voltage and power levels of the electrical event.

Accordingly, FIG. 1 illustrates that the electrical characteristics of the VSD composition, such as conductivity or trigger voltage, may be affected in part by (i) the concentration of particles, such as conductive particles, nanoparticles (e.g. HAR particles), varistor particles, and/or core shell particles (as described herein); (ii) electrical and physical characteristics of the particles, including resistive characteristics (which are affected by the type of particles, such as whether the particles are core shelled or conductors); and (iii) electrical characteristics of the polymer or binder.

Specific compositions and techniques by which organic and/or HAR particles are incorporated into the composition of VSD material is described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES; both of the aforementioned patent applications are incorporated by reference in their respective entirety by this application.

Some embodiments may provide for VSD material that includes varistor particles as a portion of its particle constituents. Embodiments may incorporate a concentration of particles that individually exhibit non-linear resistive properties, so as to be considered active varistor particles. Such particles typically comprise zinc oxide, titanium dioxide, Bismuth oxide, Indium oxide, in oxide, nickel oxide, copper oxide, silver oxide, praseodymium oxide, Tungsten oxide, and/or antimony oxide. Such a concentration of varistor particles may be formed from sintering the varistor particles (e.g. zinc oxide) and then mixing the sintered particles into the VSD composition. In some applications, the varistor particle compounds are formed from a combination of major components and minor components, where the major components are zinc oxide or titanium dioxide, and the minor components or other metal oxides (such as listed above) that melt of diffuse to the grain boundary of the major component through a process such as sintering.

The particle loading level of VSD material using core shelled particles, as described by embodiments herein, may vary below or above the percolation threshold, depending on the electrical or physical characteristics desired from the VSD material. Particles with high bandgap (e.g. using insulative shell layer(s)) may be used to enable the VSD composition to exceed the percolation threshold. Accordingly, in some embodiments, the total particle concentration of the VSD material, with the inclusion of a concentration of core shelled particles (such as described herein), is sufficient in quantity so that the particle concentration exceeds the percolation threshold of the composition. In particular, some embodiments provide that the concentration of core shelled particles may be varied in order to have the total particle constituency of the composition exceed the percolation threshold.

Under some conventional approaches, the composition of VSD material has included metal or conductive particles that are dispersed in the binder of the VSD material. The metal particles may range in size and quantity, depending in some cases on desired electrical characteristics for the VSD material. In particular, metal particles may be selected to have characteristics that affect a particular electrical characteristic. For example, to obtain lower clamp value (e.g. an amount of applied voltage required to enable VSD material to be conductive), the composition of VSD material may include a relatively higher volume fraction of metal particles. As a result, it becomes difficult to maintain a low initial leakage current (or high resistance) at low biases due to the formation of conductive paths (shorting) by the metal particles.

Figure 2A:
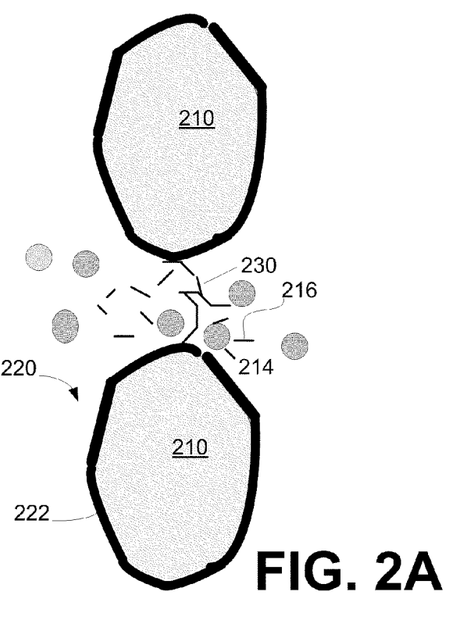
FIG. 2A illustrates use of a core shell structure for metal particle constituents of a composition of VSD material, under an embodiment.
Figure 2B:
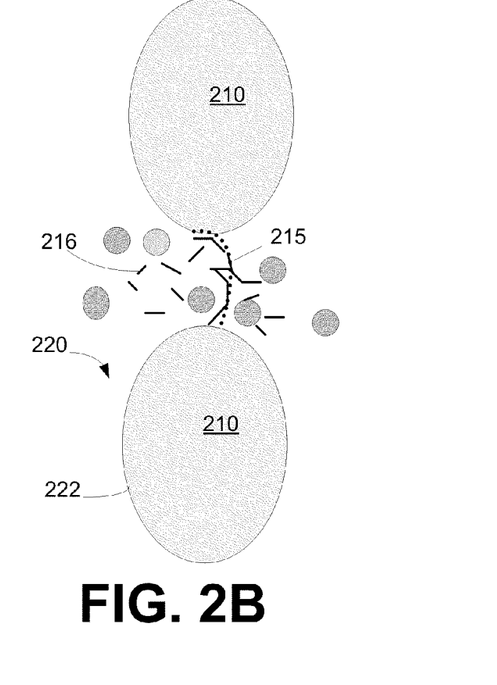
FIG. 2B illustrates VSD material that includes a combination of conductive/semiconductive and/or nano-dimensioned particles, to illustrate a comparison with other embodiments described herein.

FIG. 2A illustrates a core shell structure that can substitute for non-shelled conductive particle constituents (e.g. metal particles) for use in a composition of VSD material, according to an embodiment. As used herein, a core shell particle includes a core and one or more shell layers. According to some embodiments, at least some metal particles 210 that are constituents of VSD material 100 (see FIG. 1) are modified into conductive core shell particles 220 that, when dispersed in sufficient quantity in the binder (not shown), reduce the creation of off-state leakage current and enable increase concentration of metal/conductive particles (including HAR particles), even beyond the level of percolation. An embodiment of FIG. 2A depicts VSD material 100 (FIG. 1) as comprising conductive core shell particles 220 and semiconductive particles 214. The addition of HAR particles 230 may further enhance the electrical characteristics of the composition. The use of core shell particles, with other particles (such as HAR particles) enable the total particle concentration loaded into the binder 105 (see FIG. 1) to equal or exceed the percolation level. In absence of core shell structures 220, loading particles beyond percolation would cause the VSD material 100 to lose its electrical characteristics of being insulative in absence of a field that exceeds some threshold. Specifically, the VSD material may behave as a conductor. But the use of core shell particles 220 enables higher loading concentrations of particles, such as HAR particles and semiconductor particles, thereby enabling the composition of VSD material to have lower clamp voltages and leakage current.

FIG. 2B illustrates VSD material that includes a combination of conductive/semiconductive and/or nano-dimensioned particles, to illustrate a comparison with embodiments in which a VSD composition includes core shell particles (single or multi-layered). In FIG. 2B, the particles of the VSD composition are shown to inadvertently align to form incidental conductive paths 215. The incidental conductive path 215 may arise from conductive regions of individual particles being sufficient to cause some current flow across a thickness of the VSD material 100 (see FIG. 1). While VSD material may be mixed to minimize such contacts, the more conductive particles exist in the VSD composition, the more likely the formation of conductive regions and incidental conductive paths. If sufficient number of particles combine to form a path across a thickness of the VSD material, undesirable effects may result. For example, such incidental conductive paths 215 can yield undesirably high leakage current (or low off-state resistance). Moreover, the probability that conductive particles combine to form incidental conductive paths 215 increases when the concentration of particles that form conductive regions approaches the percolation threshold.

As shown by an embodiment of FIG. 2A, core shell particles 220 are formed by conductive particles 210 that are processed to include one or more shell layers 222. The layers 222 may include semi- or non-conductive materials that buffer the individual particles from forming incidental conductive paths with other particles (such as shown in FIG. 2B). Thus, for example, mere contact by two adjacent core shelled particles 220 may avoid a result in which the two particles pass current as a result of contact of conductive regions, when two similarly situated conductor particles would otherwise pass current under similar circumstances. Thus, core shell particles can be substituted in for non-shelled conductor particles, as the semiconductive or non-conductive shell hinders two adjacent or touching particles from forming an incidental conductive path 215. Such core shell particles, on the other hand, can be included in the VSD composition in sufficient quantity to enable at least a portion of the composition to switch into the conductive state when the external voltage exceeds a characteristic value.

Accordingly, the metal particles 210 of the VSD material 100 are provided one or more layers of shell material 222. The shell material 222 may be semi-conductive or insulative, such provided through formation of a metal oxide shell. The metal oxide shell may be formed by, for example, thermal oxidation. As described below, the shell material 222 may be heterogeneous, so that the shell layer or layers are formed from multiple types of material. A heterogeneous core shell particle may be formed from (i) different kinds of shell layers in an individual shell layer, and/or (ii) multiple layers that are each homogeneous but formed from a different kind of material. One or more shell formation processes may be used to form the shell material 222 on individual particles. In one implementation, the oxide shell may be formed to include a relatively uniform thickness. Alternatively, the shell material may be formed to be non-uniform.

According to an embodiment provides that the shell material 222 is formed from metal oxide particles to surround the core metal particle 210. The core metal particles may be dimensioned in the micron or sub-micron range.

As mentioned, it is believed that incidental conductive paths 215 (FIG. 2B) may be formed in the VSD material 100 when metal particles 210 and/or other particles (e.g. HAR particles 216) randomly touch or align (so that their respective conductive regions pass current to one another). The presence of such incidental conductive paths 215 introduces leakage current, which can affect the quality and the expected or desired electrical characteristics of the composition of VSD material 100. In contrast, embodiments provide that by forming the shell material 222 out of one or more layers of semiconductive or resistive materials, the metal particles 210 are provided a shield against such incidental contacts. The incidental conductive path 215 that could otherwise form is impeded in its creation by the presence of the shell material about the metal particle 210. As mentioned, among other benefits, the particle loading may exceed the percolation threshold of the VSD composition.

Core Shell Particles

According to some embodiments, core shell particles are comprised of metal particles that are mixed with an oxide precursor solution to control the composition and thickness of an oxide shell on the particle. By mixing metal particles with an oxide precursor solution, it is possible to control the composition and thickness of a given layer of oxide shell. Further sintering at elevated temperature enables more durable and uniform oxide shell creation about individual metal particles.

Still further, embodiment recognize that it is also possible to form a shell with material other than oxide, such as an organic shell to impart additional properties to the metal particles.

The conductive particles 210 (i.e. the 'cores') that can be shelled and used as constituents of VSD material 100 may be selected from a wide range of materials, including (i) metals such as nickel, aluminum, titanium, iron, copper, or tungsten, stainless steel or other metal alloys; (ii) conductive metal oxides like antimony doped in oxide, indium doped in oxide, aluminum doped zinc oxide, and antimony doped zinc oxide. The shell material used to modify the conductive particle 210 can be insulative, or semiconductive. In some variations, it is possible for at least one shell layer to be formed from material that is conductive. According to embodiments, the shell material used to make the surface modification (the shell material)

may correspond to a metal oxide, such as in oxide, zinc oxide, titanium oxide, aluminum oxide, silicon oxide, nickel oxide, or copper oxide. Still further, an embodiment provides that colloidal solutions of oxide nanoparticles are formed in the presence of the conductive particles (e.g. nickel). Still further, the metal/metal oxides are low melting, e.g. less than 1000° C., such as metals and their corresponding oxides from bismuth, chromium, antimony, and praseodynium. Adsorption of the colloidal nanoparticles onto the conductive particle surface may occur by van der Waals force, electrostatic attraction, covalent bonding, steric entrapment or other means under appropriate conditions. This bound surface layer is then solidified by heating up to certain temperature in air, thus ensuring uniform coating of the conductive particles by the surface coating material. In another embodiment, conductive particles are mixed with various sol solutions with well established sol gel chemistry. The particles may be agitated and dispersed in the sol medium. After evaporation of solvent and drying a gel coating forms on the conductive particle surface which can be further solidified by heating at elevated temperatures.

Figure 2C:
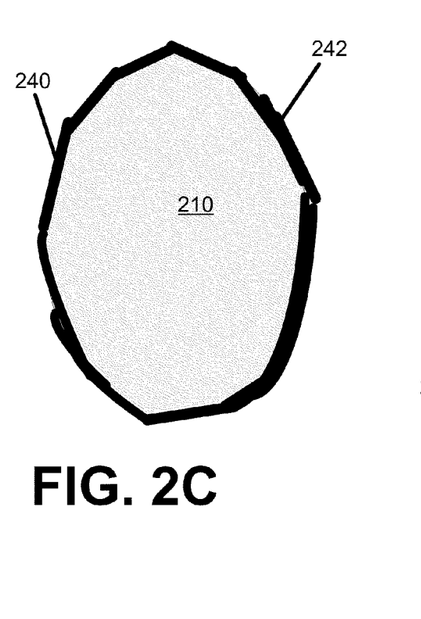
FIG. 2C illustrates conductor particles having two or more layers of shell material.

Additional coatings of the same or different coating materials can be applied onto the conductive particles surface repeatedly in similar fashion. FIG. 2C illustrates conductor particles having two or more layers of shell material. In particular, shell regions 240, 242 may include shell material bonded on shell material through performance of one or more shell forming processes, as described above. The double shell regions 240, 242 are provided either (i) substantially non-uniformly so that an exterior most shell layer exposes an underlying shell layer, or (ii) the shell regions are formed uniformly over one another. In an embodiment, separate shell forming processes may be performed sequentially to provide each shell material thickness. As such, each layer of shell material that results from performance of one shell formation process may provide or enhance a specific electrical property of the VSD material when the core shell material is used. Each of the two or more layers may be formed using processes such as described above. Moreover, each layer or thickness may comprise different kinds of material.

Figure 2D:
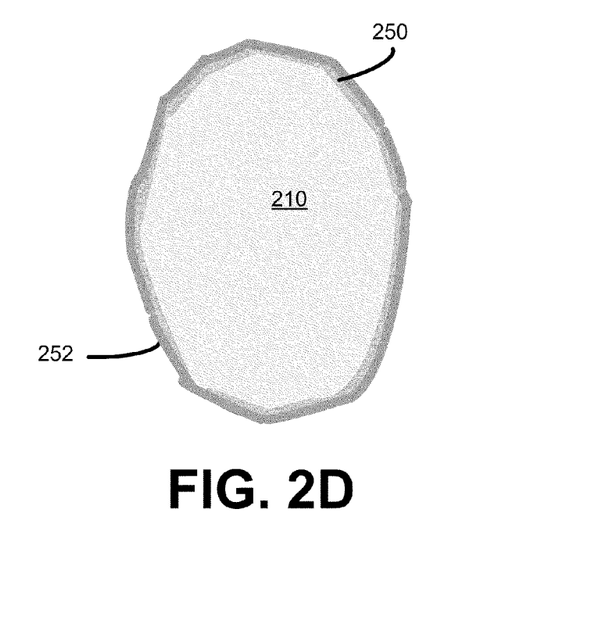
FIG. 2D illustrates conductor particles having a shell formation layer that comprises two or more kinds of materials.

FIG. 2D illustrates conductor particles having a shell formation layer that comprises two or more kinds of materials. In contrast to an embodiment of FIG. 2A, each shell material 250, 252 may bond directly to the conductor core 210, or alternatively formed in the same shell forming process. In some implementations, it is possible for some portion of the overall shell material to bond with other types of shell material to provide the shell formation. To provide shell formations comprised of multiple kinds of materials, an embodiment provides that the core conductive particles are submerged or exposed to a precursor solution that has the desired shell materials. As an alternative to a precursor solution, an organo-metallic solution containing desired shell material (which may include different types of shell material) may be used. In an embodiment shown, each of the layers of shell material 250, 252 are substantially uniform. However, one or more both layers may be non-uniform, so that the exterior 252 exposes the underlying shell material 250, or even the core 210.

With regard to FIG. 2C and FIG. 2D, the core and shell materials of the core shell particle constituents may be selected based on desired electrical or physical characteristics. In particular, an overall electrical or physical characteristic of the VSD material as a whole may be tuned (or intentionally affected) through selection of a core particle or a shell material (for one or more layers). The use of multiple shell layers and/or multiple kinds of shell material further enhance the ability for VSD material to be designed or tuned for a particular electrical or physical characteristic, in that additional shell material and/or layers may be incorporated into the design/tuning of the VSD composition. Among the characteristics of VSD material that can be tuned with selection of shell/core material, the (i) on- or off-state resistance, (ii) band-gap and (iii) wettability of the VSD material may be affected with core or shell material selection.

The formation of each type of material may be performed in one combined process (e.g. one precursor solution with multiple types of material) or in multiple processes (e.g. separate precursor solution for each shell material type). In one embodiment, when heterogeneous shells are formed, the material that comprises the shells may have different electrical properties or characteristics. For example, one implementation may combine a metal oxide and a nano-particle as the shell material, while another implementation may use two kinds of metal oxides as the shell material.

As shown by FIG. 2C and FIG. 2D, multilayer and/or heterogeneous material coating with complicated physical properties can thus be realized. The following provide more detailed examples of shell material formed on metal particles.

CORE SHELL PARTICLE FORMULATION EXAMPLES

1. Nickel Oxide Shell

In one embodiment, nickel oxide forms at least one of the shell layers, and is formed a metal particle core. A core shell particle (for use with VSD composition) comprising nickel core and nickel oxide shell material may be formulated as follows: (1) Mix 120 mL 1M NiSO4 solution with 90 mL 0.2 M K2S2O8 solution and 60 mL DI water; (2) Add 1100 g of Ni (for example, Novamet 4SP-10) to the above solution; (3) Mix with an overhead mixer for duration; and (4) Add 24 mL NH4OH solution (30% wt) quickly and under vigorous stirring. The mixture is further mixed for 8 hrs at room temperature. The solution is filtered and rinsed with DI water and ethanol. The filtered powder is then dried at 100 C in vacuum for 2 hour. The dried powder is finally heated in a furnace at 300 C for 1 to 3 hours. All the chemicals are obtained from Sigma-Aldrich.

In embodiment, the coating formulation includes (i) 20 to 30% vol surface modified nickel particles, (ii) 5 to 25% vol metal oxide semiconductors with primary particle size less than 1 um (e.g. TiO2). Epoxy and epoxy functionalized polymers are used as the polymer matrix materials, solvents can be added to adjust viscosity for mixing (i.e. N-methypyrrolidinone or 1-methoxy-2-propanol). Appropriate types and amounts of cross-linkers may be dispersed in the binder. Small amount of dispersants may be used to disperse particles with size less than 1 um.

Results: A layer of VSD material with 26% vol 4SP-10 nickel treated as above, formulated such as described above, has a resulting clamp voltage of 263V at 5 mil electrode gap size. Resistances of all samples before and after testing are greater than $10^{10}$ ohm at low biases.

A layer of VSD material with 26% vol treated 4SP-20 nickel and 2% untreated INP-400 nickel (both from Novamet) has a resulting clamp voltage of 194V at 5 mil electrode gap size. The resistance of the sample is greater than $10^6$ ohm after testing, measured at low bias.

2. Zinc Oxide Shell

In another embodiment, zinc oxide is used for shell material. A zinc oxide shell may be formed over a metal particle.

Formation of a core shell particle that uses a zinc oxide shell may be as follows: (1) 1M zinc acetate solution is used to form zinc oxide on the nickel particle surface; (2) 120 mL 1M zinc acetate solution is mixed with 90 mL 0.2M K2S2O8 solution and 60 mL DI water; (3) 1100 g of Ni (for example, Novamet 4SP-20) is added to the above solution and mixed with an overhead mixer; (4) After 15 minutes, 24 mL NH4OH solution (30% wt) is added quickly under vigorous stirring. The mixture is further mixed for 8 hrs at room temperature. The resulting mixture is filtered and rinsed with DI water and ethanol for several times. The filtered powder is then dried at 100° C. in vacuum for 2 hour. The dried powder is finally heated in a furnace at 300° C. for 2 hours. All the chemicals are obtained from Sigma-Aldrich.

A VSD coating with 26% vol 4SP-20 nickel treated as above has a resulting clamp voltage of 238V at 5 mil electrode gap size. Resistances of all samples before and after testing are greater than 10^10 ohm at low biases.

3. Titanium Oxide Shell

Still further, an embodiment provides for titanium oxide as the shell material. One or more layers of titanium oxide shell are formulated over a metal particle. Formation of a core shell particle that includes a titanium oxide shell may be as follows: (1) 50 mL of titanium tetraisopropoxide may be mixed with 250 mL of 2-methoxyethanol and 25 mL of ethanolamine; (2) While keeping under argon flow, the mixture is heated at 80° C. and 120° C. for 1 hour each and repeated once. The resulting product used the titanium oxide precursor solution to coat nickel particles.

Under one formulation, 200 g of above titanium oxide precursor solution is mixed with 500 g of isopropanol. Next, 600 g of nickel powder (for example, Novamet 4SP-20) is added under vigorous stirring by an overhead stirrer and sonicated at the same time. After sonicating (or mixing) for 60 minutes, the sonicator horn is removed. Stirring may be maintained with heating at 70° C. to remove most of volatile solvents in the mixture. The mixture may be placed in an oven at 80° C. until all solvents evaporate. The dried powder is then heated at 300° C. for two hours and used in coating formulation.

A VSD coating with 26% vol 4SP-20 nickel treated as above gives a clamp voltage of 309V at 5 mil electrode gap size. Resistances of all samples before and after testing are greater than 10^10 ohm at low biases.

Still further, in another embodiment, a core shell may comprise a metal-core, a metal oxide shell, and a polymer shell. In one implementation, the metal core is nickel, and the oxide shell is nickel oxide. The polymer shell may be formed using, for example, hydrosiloxane treatment, other embodiments would include reacting the surface of the shell with silane coupling agents such as aminopropyltriethoxysilane, acryloxypropyltriethoxysilane, or epoxypropyltriethoxysilane.

Still further, some embodiments provide for a core shell particle that comprises a cross-lined polymer shell formed using a hydrosiloxane treatment. A cross-linked polymer shell may be formed by linking hydrosiloxane group polymers that comprise the shell of the core shelled particle. This polymer (e.g. polymethylhydrosiloxane) is cross-linked with platinum or peroxide in solution. More specific examples of surface-modifying particles for use as core shell particle constituents of VSD material are described below.

Surface Modification of Metal Particles

Oxidized Ni particles may be treated with a D4-H molecule (1,3,5,7-tetramethyl cyclotetrasiloxane, from Gelest) using the vapor phase reaction. 600 g of oxidized Ni power is transferred into a 500 ml teflon container. Then 3% by wt of D4-His added. The container is mixed and placed in a furnace set at a temperature of 150° C. for several hours. Since the boiling point of D4-His 135° C., D4-H vaporizes at 150° C. resulting in the ring opening polymerization of D4-H on the NiO/NiO$_2$ surface of Ni. The Ni particles are rinsed with ethanol and DI The filtered powder is dried.

The surface modification of nickel oxide with siloxanes (monomeric or polymeric) can be carried out either by solution or vapor phase reaction. In the following two examples, the solution and vapor phase reactions of nickel oxide with 1,3,5,7-tetramethylcyclotetrasiloxane (D4H) are described. In addition to D4H, other siloxanes can be employed for such reactions on nickel surfaces; Octamethylcyclotetrasiloxane (D4), octamethyltrisiloxane (Si3), decamethyltetrasiloxane (Si4), dodecamethylpentasiloxane (Si5), octylsilane, polymethylhydridosiloxane and polydimethylsiloxane (PDMS).

Solution phase reaction of 1,3,5,7-tetramethylcyclotetrasiloxane (D4H) on nickel oxide: About 2-5% volume of D4H with respect to a solvent is treated with nickel oxide. The solvents may correspond to, for example hexane, heptanes or toluene. The reaction temperatures are typically 90-110° C. and the reaction times may vary. In one process, 2.5 g of D4H and 100 g of nickel are taken in 150 g of toluene and refluxed for a duration. After the reaction, the reaction mixture are treated and dried at 100° C. overnight to obtain the product in 90-95% yield.

Vapor phase reaction of 1,3,5,7-tetramethylcyclotetrasiloxane (D4H) on nickel oxide: About 2-10 weight % of D4H may be taken with nickel oxide in an autoclavable teflon container. This is heated to above the boiling point of D4H in an oven. As an example, 15 g of D4H is taken with 600 g of nickel oxide using a sealed teflon container. This is placed in a pre-heated oven at 150° C. The container is then cooled to room temperature, and the nickel oxide is washed with toluene to remove the un-attached siloxane monomer and filtered. Further drying provides surface modified nickel oxide in 90-95% yield.

Other types of reactions on siloxane-modified nickel oxide are possible. For example, the Si—H group can be used for coupling hydridosilane with other functional group containing olefins to tailor the surface chemistry. An allyl amine or acrylonitrile can be used to react with hydridosiloxane-modified nickel oxide using a Platinum catalyst (eg. Chloroplatinic acid). This will result in nickel oxide surfaces containing amine or nitrile end groups. Similarly, the reaction with perfluorobutylethylne results in highly fluorine-rich end groups on the nickel oxide surface.

In another example, the siloxane-treated nickel oxide surface is treated with a radical initiator such as benzoyl peroxide that can generate silyl radical, which in turn may initiate a polymerization of olefinic substrates, such as acrylate monomers. As an example, D4H-modified nickel oxide was reacted with hexanediol-diacrylate in presence of benzoyl peroxide to give nickel oxide covered with acrylate shell.

Table 1 lists a summary of the atomic composition of the surface modified nickel that can be included in VSD composition, according to some embodiments as measured by x-ray photoelectron spectroscopy.

TABLE 1

| Surface Oxide | Ni Type | Ni % AT | O % AT | Zn % AT | Ti % AT |
|---|---|---|---|---|---|
| Nickel oxide | 4SP-10 | 89.2 | 10.8 | | |

TABLE 1-continued

| Surface Oxide | Ni Type | Ni % AT | O % AT | Zn % AT | Ti % AT |
|---|---|---|---|---|---|
| Nickel oxide | 4SP-20 | 91.02 | 8.98 | | |
| Zinc oxide | 4SP-20 | 88.34 | 10.22 | 1.44 | |
| Titanium oxide | 4SP-20 | 71.88 | 23.38 | | 4.74 |

VSD Formulation Using Core Shelled Particles

With reference to embodiments described, the core shell particles may be formulated using the following example. Core shell particles such as described may be included as one of the particle constituents of VSD material, in a manner described with prior embodiments. In one embodiment, the VSD material includes nanoparticles, such as carbon-nanotubes as particle constituents. The nanoparticles (0.6 g) are mixed into the polymer binder (e.g. EPON 828 or difunctional bisphenol A/epichlorohydrin by HEXION) (70.8 g) and GP611 epoxy functional dimethylpolysiloxane copolymer, by GENESEE POLYMERS CORP.) (70.8 g). A solvent such as N-methyl-2-pyrrolidone is added (140 g). Appropriate curing and catalyst agents are applied and mixed uniformly. A pre-mixture is formed comprising nanoparticles (e.g. carbon nanotubes), resin and solvent. 78.5 g of $TiO_2$ and 2.6 g of isopropyl tri(N-ethylenediamino) ethyl titanate are added during the mixing process. 617.8 g of wet-chemistry processed oxidized Ni particles (provided as core shelled particle constituents) Are then added with 85.1 g of additional $TiO_2$ and 142.3 g of $Bi_2O_3$. Mixing was continued to achieve uniform constituency. High shear mixing over long durations is used to achieve desired uniformity, optionally sonication may also be desirable to improve mixing. According to an embodiment, the formulation results in VSD material that comprises Ni core shell particles having a trigger voltage of approximately 313V and a clamp voltage of approximately 217V for a 3 mil gap with 20 pad diameter measured by a transmission line pulse.

Figure 3A:
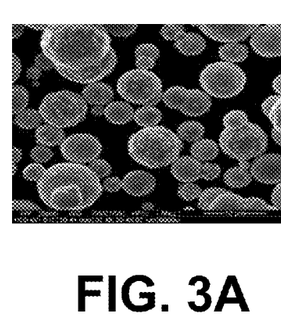
FIG. 3A through FIG. 3C illustrate actual images of surface-modified conductive particles that are formed using a precursor solution to form the shell material.
Figure 3B:
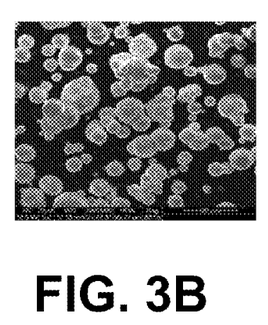
Figure 3C:
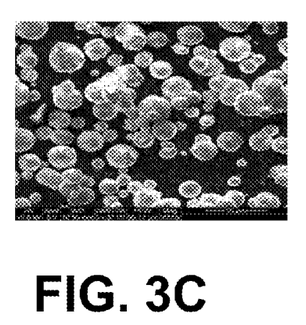

FIG. 3A through FIG. 3C illustrate actual images of surface-modified conductive particles that are formed using a precursor solution to form the shell material. Specifically, FIG. 3A illustrates VSD material having nickel core shell particles, where the shell material is nickel oxide. FIG. 3B illustrates zinc oxide as the shell material on core nickel particles. FIG. 3C illustrates titanium oxide shells formed on nickel. The examples further show that the shells may be formed to different sizes. Reduction in size may enable greater quantities of the core particle to be used. The shell material, more preferably, is a metal oxide composed of two different metal oxide materials in the shell leading to synergistic electrical properties. For example, nickel metal particles can be treated and coated to form a nickel metal core and NiOx—ZnO shell. The shell would have better conductive properties than NiOx alone and better insulative properties and an ZnO only shell. Another example would be a nickel metal core and a NiOx—TiOx shell. NiOx has a lower band gap but TiOx is extremely durable under high voltage pulsing, is hydrolytically stable, and is corrosion resistant. Hence, synergistically enhanced shell properties can be enhanced by mixed metal oxide shell construction.

As an alternative to embodiments described, the core of the core shell particle may comprise a varistor particle, such as zinc-oxide or titanium dioxide. Still further, other embodiments may mix varistors and core shell particles such as described herein.

Conductor Shell and Conductor-on-Conductor Core Shell Particles

In many cases, conductive cores made of different materials in a layered structure can provide desirable electrical or physical properties for particular compositions or applications of VSD material. For example, it is often desirable to incorporate conductive particles with different sizes and shapes in a VSD formulation in order to achieve targeted electrical properties.

Accordingly, some embodiments provide a VSD formulation that includes a core shelled particle comprising (i) a core formed from insulating, semiconducting or conducting material, and (ii) one or more additional shell layers that have at least an outmost layer that is formed from conductive material. Such conductive particles provide advantages such as being tunable in size and shape. The core materials can be chosen from various materials such as silica particles, polymeric particles, metal particles, and graphite. The overall size of the core shelled particles may range from sub-micrometers to micrometers, and have various shapes (including those selected by design).

Depending on the material selected for the core, different processes can be used to form the outer shell layers of the conductive core shelled particles. Suitable processes for creating conductive core shell particles include chemical precipitation, chemical vapor deposition, physical vapor deposition, immersion plating, electroless plating or electrolytic plating. Based on conductivity, chemical reactivity and processability requirements, different types of metal can be chosen to form the conductive shell layer(s). Among some of the considerations in selecting the material for the conductive shell layer, the selected material should be compatible with the binder or matrix (e.g. a resin matrix system), with or without further surface modification. Furthermore, the hardness and adhesion of the shell layer to the core particle should be sufficient to withstand the shearing force during VSD formulation process (e.g. sonic agitators etc.)

Figure 4:
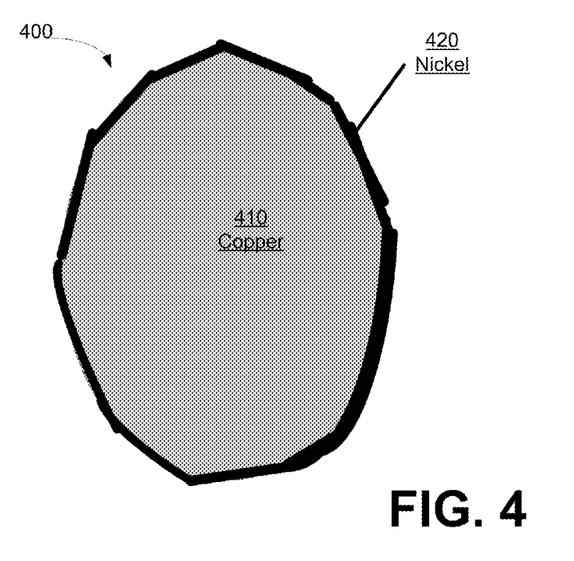
FIG. 4 illustrates a conductor-on-conductor core shell particle constituent for use in a VSD formulation, according to an embodiment.

In some embodiments, the conductor-on-conductor core shell particle includes (i) a core that is a metal of a first kind, and (ii) a shell layer that is a metal of a second kind. FIG. 4 illustrates an embodiment in which a core shell particle 400 includes a shell layer 420 formed from nickel material, and a core 410 formed from copper. While other metals and materials may be substituted for the copper/nickel structure shown, embodiments recognize that (i) nickel is stable when mixed in a polymer matrix (as required in VSD formulations); (ii) other common conductive particles, on the other hand, can have undesirable results when included in VSD material in finished form. Silver and zinc, for example, have propensity to migrate when mixed in a polymer formulation (which may include other particles), leading to particle agglomeration that makes the VSD formulation ineffective or subject to high leakage current and other poor electrical properties. Likewise, embodiments recognize that copper has the propensity to corrode. In selecting the exterior shell layer, embodiments recognize that nickel is both (i) stable in a polymer matrix with other particles, and (ii) relatively common. Accordingly, a composition of VSD material that includes the conductor core shell structure of FIG. 4, enables a conductive particle constituent that has desirable characteristics of nickel (e.g. ease of processing in resin system), but includes another material in its core. In one implementation, dispersed uniform copper particles that vary in size between 0.1 to 5.0 micrometers can be formed by a polyol reduction reaction process. Utilizing the same technique, 30 to 900 nm nickel particles can be formed. In contrast, the copper core is chemically reactive even after chemical passivation (such as silver coating or passivating by organic surface modifying molecules) and resin matrix chemistry must be carefully designed to avoid unwanted reactions or controllable processing conditions, for example, undesirably high viscosity. To be used in a VSD formulation, one consideration for the metal filler is relatively stable and resistance to oxidation during processing at elevated temperatures (for example, 200° C.) in ambient atmosphere. On the other hand, to achieve the required electrical properties of a VSD formulation, metal filler particles with sizes in micrometers are often desired. As a result, copper particles with micrometer size (for example, 1-3 micrometers) formed by the polyol reduction reaction can be used as the template particles to grow a shell of nickel layer using the same reaction medium and process. After the formation of nickel shell layer and reaching the appropriate overall particle size (for example 3-5 micrometers), the conductive particles can be used as a conductive particle constituent for a formulation of VSD material. Electroless nickel plating, an auto-catalytic chemical technique, can be used to deposit a layer of nickel alloy on particle surface. In one approach, after absorbing of lead (or platinum or palladium) catalyst onto particle surface (for example, silica, graphite, polymeric beads, metal particles etc.), a nickel plating bath solution can be introduced to form nickel layer on the particle surface. After the formation of nickel shell layer of appropriate thickness, the core shell particle is formed for the VSD formulation.

As an alternative or variation to embodiments described, the conductor-on-conductor core shell structures can be further modified so that the respective shells of the individual particles include a metal oxide layer. Accordingly, under some embodiments, the core shell particles comprise a metal-core and a metal oxide shell. Still further, the core shell particles may comprise (i) a metal core, (ii) one or more shell layers, including at least one metal shell layer; and (iii) a metal oxide shell layer. The metal oxide shell layer may be formed on the core shell particle as described with various prior embodiments. For example, in one implementation, the core shell particles are comprised of (i) a copper core, (ii) a nickel shell, and (iii) a nickel oxide shell. The nickel oxide shell may be formed on core shell structure in a manner described with prior embodiments.

As a variation to conductor-on-conductor, the core may be formed from semiconductive material, and one or more shell layers may be formed from semi-conductive material. In one embodiment, the core material is formed from a metal oxide of a first type, and one or more of the shell layers is formed from a metal oxide of a second type. In one embodiment, the core is formed from TiO2 and the shell includes at least one layer formed from ATO (antimony in oxide). Still further, other implementations include zinc oxide, bismuth oxide, in oxide, nickel oxide, Indium in oxide (ITO), Antimony zinc oxide (AZO), or any other metal oxide material described elsewhere in this application for either the core and/or the shell layers.

As another variation, one or more embodiments provide that either the conductor core, or one of the one or more shell layers, is surface modified to include a polymer, so to provide the conductor core shell particle with a polymer shell layer. The formation of the polymer shell layer may be performed in a manner described with prior embodiments. The polymer shell layer may be an interior shell layer (e.g. formed about the core, with other material forming an exterior shell layer), or an exterior layer. In some variations, the polymer shell layer is formed from a cross-linked polymer.

VSD Material Applications

Numerous applications exist for compositions of VSD material in accordance with any of the embodiments described herein. In particular, embodiments provide for VSD material to be provided on substrate devices, such as printed circuit boards, semiconductor packages, discrete devices, thin film electronics, as well as more specific applications such as LEDs and radio-frequency devices (e.g. RFID tags). Still further, other applications may provide for use of VSD material such as described herein with a liquid crystal display, organic light emissive display, electrochromic display, electrophoretic display, or back plane driver for such devices. The purpose for including the VSD material may be to enhance handling of transient and overvoltage conditions, such as may arise with ESD events. Another application for VSD material includes metal deposition, as described in U.S. Pat. No. 6,797,125 to L. Kosowsky (which is hereby incorporated by reference in its entirety).

Figure 5A:
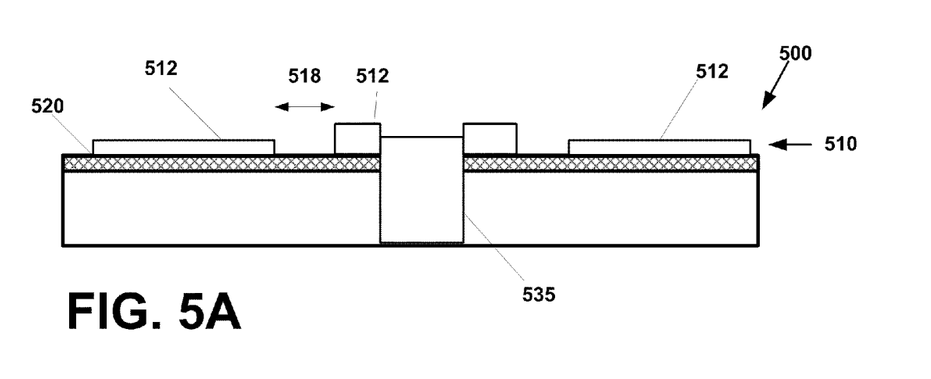
FIG. 5A illustrates a substrate device that is configured with VSD material having a composition such as described with any of the embodiments provided herein.

FIG. 5A illustrates a substrate device that is configured with VSD material having a composition such as described with any of the embodiments provided herein. As shown by FIG. 5A, the substrate device 500 corresponds to, for example, a printed circuit board. A conductive layer 510 comprising electrodes 512 and other trace elements or interconnects is formed on a thickness of surface of the substrate 500. In a configuration as shown, VSD material 520 (having a composition such as described with any of the embodiments described herein) may be provided on substrate 500 (e.g. as part of a core layer structure) in order provide, in presence of a suitable electrical event (e.g. ESD), a lateral switch between electrodes 512 that overlay the VSD layer 520. The gap 518 between the electrode 512 acts as a lateral or horizontal switch that is triggered 'on' when a sufficient transient electrical event takes place. In one application, one of the electrodes 512 is a ground element that extends to a ground plane or device. The grounding electrode 512 interconnects other conductive elements 512 (that are separated by gap 518) to ground as a result of material in the VSD layer 520 being switched into the conductive state (as a result of the transient electrical event).

In one implementation, a via 535 extends from the grounding electrode 512 into the thickness of the substrate 500. The via provides electrical connectivity to complete the ground path that extends from the grounding electrode 512. The portion of the VSD layer that underlies the gap 518 bridges the conductive elements 512, so that the transient electrical event is grounded, thus protecting components and devices that are interconnected to conductive elements 512 that comprise the conductive layer 510.

Figure 5B:
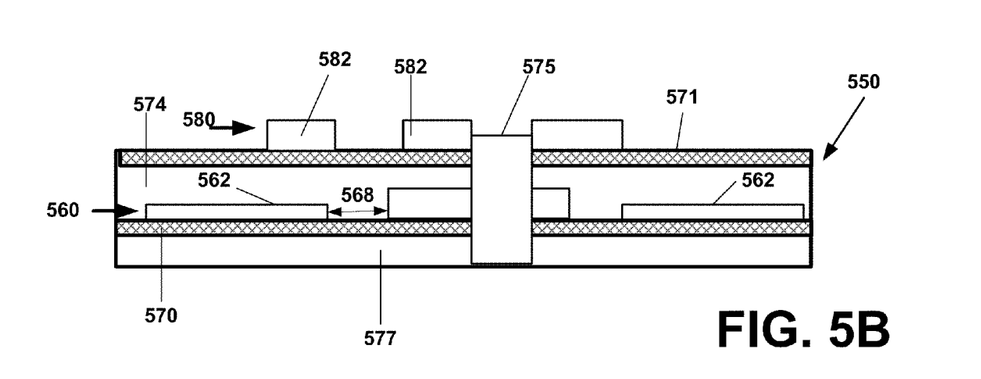
FIG. 5B illustrates a configuration in which a conductive layer is embedded in a substrate.

FIG. 5B illustrates a configuration in which a conductive layer is embedded in a substrate. In a configuration shown, a conductive layer 560 comprising electrodes 562, 562 is distributed within a thickness of a substrate 550. A layer of VSD material 570 and dielectric material 574 (e.g. B-stage material) may overlay the embedded conductive layer. Additional layers of dielectric material 577 may also be included, such as directly underneath or in contact with the VSD layer 570. Surface electrodes 582, 582 comprise a conductive layer 580 provided on a surface of the substrate 550. The surface electrodes 582, 582 may also overlay a layer VSD material 571. One or more vias 575 may electrically interconnect electrodes/conductive elements of conductive layers 560, 580. The layers of VSD material 570, 571 are positioned so as to horizontally switch and bridge adjacent electrodes across a gap 568 of respective conductive layers 560, 580 when transient electrical events of sufficient magnitude reach the VSD material.

Figure 5C:
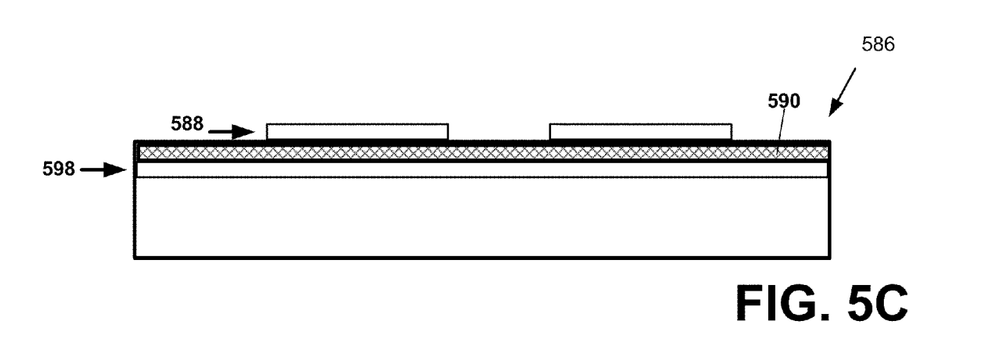
FIG. 5C illustrates a vertical switching arrangement for incorporating VSD material into a substrate.

As an alternative or variation, FIG. 5C illustrates a vertical switching arrangement for incorporating VSD material into a substrate. A substrate 586 incorporates a layer of VSD material 590 that separates two layers of conductive material 588, 598. In one implementation, one of the conductive layers 598 is embedded. When a transient electrical event reaches the layer of VSD material 590, it switches conductive and bridges the conductive layers 588, 598. The vertical switching configuration may also be used to interconnect conductive elements to ground. For example, the embedded conductive layer 598 may provide a grounding plane.

Figure 6:
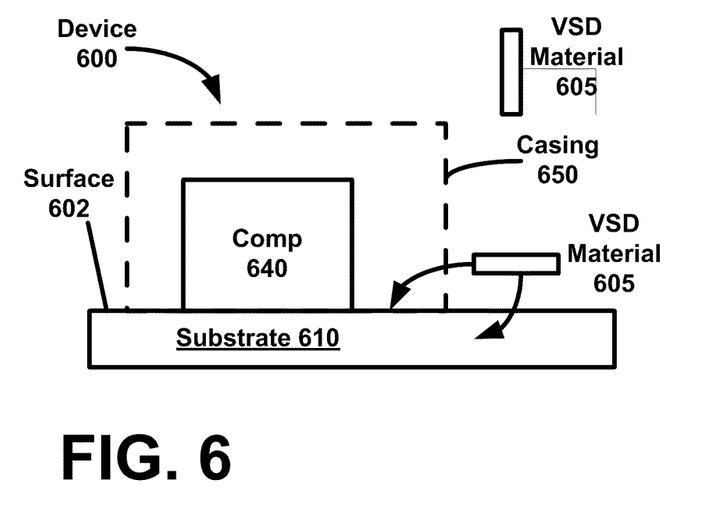
FIG. 6 is a simplified diagram of an electronic device on which VSD material in accordance with embodiments described herein may be provided.

FIG. 6 is a simplified diagram of an electronic device on which VSD material in accordance with embodiments described herein may be provided. FIG. 6 illustrates a device 600 including substrate 610, component 640, and optionally casing or housing 650. VSD material 605 (in accordance with any of the embodiments described) may be incorporated into any one or more of many locations, including at a location on a surface 602, underneath the surface 602 (such as under its trace elements or under component 640), or within a thickness of substrate 610. Alternatively, the VSD material may be incorporated into the casing 650. In each case, the VSD material 605 may be incorporated so as to couple with conductive elements, such as trace leads, when voltage exceeding the characteristic voltage is present. Thus, the VSD material 605 is a conductive element in the presence of a specific voltage condition.

With respect to any of the applications described herein, device 600 may be a display device. For example, component 640 may correspond to an LED that illuminates from the substrate 610. The positioning and configuration of the VSD material 605 on substrate 610 may be selective to accommodate the electrical leads, terminals (i.e. input or outputs) and other conductive elements that are provided with, used by or incorporated into the light-emitting device. As an alternative, the VSD material may be incorporated between the positive and negative leads of the LED device, apart from a substrate. Still further, one or more embodiments provide for use of organic LEDs, in which case VSD material may be provided, for example, underneath an organic light-emitting diode (OLED).

With regard to LEDs and other light emitting devices, any of the embodiments described in U.S. patent application Ser. No. 11/562,289 (which is incorporated by reference herein) may be implemented with VSD material such as described with other embodiments of this application.

Alternatively, the device 600 may correspond to a wireless communication device, such as a radio-frequency identification device. With regard to wireless communication devices such as radio-frequency identification devices (RFID) and wireless communication components, VSD material may protect the component 640 from, for example, overcharge or ESD events. In such cases, component 640 may correspond to a chip or wireless communication component of the device. Alternatively, the use of VSD material 605 may protect other components from charge that may be caused by the component 640. For example, component 640 may correspond to a battery, and the VSD material 605 may be provided as a trace element on a surface of the substrate 610 to protect against voltage conditions that arise from a battery event. Any composition of VSD material in accordance with embodiments described herein may be implemented for use as VSD material for device and device configurations described in U.S. patent application Ser. No. 11/562,222 (incorporated by reference herein), which describes numerous implementations of wireless communication devices which incorporate VSD material.

As an alternative or variation, the component 640 may correspond to, for example, a discrete semiconductor device. The VSD material 605 may be integrated with the component, or positioned to electrically couple to the component in the presence of a voltage that switches the material on.

Still further, device 600 may correspond to a packaged device, or alternatively, a semiconductor package for receiving a substrate component. VSD material 605 may be combined with the casing 650 prior to substrate 610 or component 640 being included in the device.

Although illustrative embodiments have been described in detail herein with reference to the accompanying drawings, variations to specific embodiments and details are encompassed herein. It is intended that the scope of the invention is defined by the following claims and their equivalents. Furthermore, it is contemplated that a particular feature described, either individually or as part of an embodiment, can be combined with other individually described features, or parts of other embodiments. Thus, absence of describing combinations should not preclude the inventor(s) from claiming rights to such combinations.

What is claimed is:

1. A substrate comprising:
   a first conductive layer;
   a second conductive layer;
   a voltage switchable dielectric (VSD) material between the first conductive layer and the second conductive layer, the VSD comprising:
      a polymer binder; and
      a quantity of particles dispersed in the binder, the quantity of particles including nano-dimensioned particles and a set of core shell particles, each core shell particle of the set including (i) a core formed from conductive material, and (ii) at least one shell layer, the at least one shell layer comprising shell material formed from at least two metal oxides, the nano-dimensioned particles comprising at least one of metal oxide, nanorods, or nanowires,
   wherein the VSD material is dielectric in the absence of an applied voltage that exceeds a characteristic level and conductive in the presence of the applied voltage that exceeds the characteristic level.

2. The substrate of claim 1, wherein the at least one shell layer comprises multiple shell layers, the multiple shell layers including an exterior layer formed from conductive material that is different than the conductive material of the core, the conductive material of at least one of the multiple shell layers includes copper.

3. The substrate of claim 1, wherein the quantity of particles are dispersed in the polymer binder in a concentration that is at or above a percolation level of the VSD material.

4. The substrate of claim 1, wherein the at least one shell layer includes a nickel oxide layer.

5. The substrate of claim 1, wherein at least one of the core or the at least one shell layer is surface modified to include a polymer.

6. The substrate of claim 1, wherein at least one of the core or the at least one shell layer is surface modified to include a cross-linked polymer.

7. The substrate of claim 1, wherein the quantity of particles further comprises non-core shell particles that include at least one of: conductive particles, semiconductor particles and the nano-dimensioned particles.

8. The substrate of claim 7, wherein the quantity of particles further comprises active varistor particles.

9. The substrate of claim 1, wherein the nano-dimensioned particles do not include nanowires or nanorods.

10. The substrate of claim 1, wherein the nano-dimensioned particles do not include metal oxide.

11. The substrate of claim 1, wherein the quantity of particles further comprises non-core shell particles that include Boron.

12. The substrate of claim 1, wherein the polymer binder comprises a conductive polymer.

13. The substrate of claim 1, wherein the at least one shell layer includes the at least one layer of conductive material as an exterior-most layer.

14. The substrate of claim 1, wherein the at least one shell layer includes at least one layer of material that is comprised of nickel.

15. The substrate of claim 1, wherein the conductor core is formed from material that includes copper.

16. The substrate of claim 1, wherein the at least one shell layer include a first layer of a first material, and a second layer of a second material that is different than the first material.

17. The substrate of claim 16, wherein each of the first material and the second material is a metal.

18. The substrate of claim 1, wherein current flows from the first conductive layer to the second conductive layer when the applied voltage exceeds the characteristic level.

19. A composition of a substrate comprising:
a first conductive layer;
a second conductive layer;
a voltage switchable dielectric (VSD) material between the first conductive layer and the second conductive layer, the composition of the VSD material comprising:
a polymer binder; and
a quantity of particles dispersed in the binder, the quantity of particles including nano-dimensioned particles and a set of core shell particles, each core shell particle comprising (i) a conductive or semi-conductive core, and (ii) at least one shell layer, the at least one shell layer comprising shell material formed from at least two metal oxides, the at least one shell layer including an exterior layer formed from a metal oxide, the nano-dimensioned particles comprising at least one of metal oxide, nanorods, or nanowires,
wherein the composition of VSD material is dielectric in the absence of an applied voltage that exceeds a characteristic level and conductive in the presence of the applied voltage that exceeds the characteristic level.

20. The substrate of claim 19, wherein the at least one shell layer of the VSD material include nickel.

21. The substrate of claim 19, wherein the at least one shell layer of the VSD material include a nickel layer and a nickel oxide layer.

22. The substrate of claim 19, wherein the core of the VSD material is conductive and formed from copper.

23. The substrate of claim 19, wherein at least one of the core or one of the at least one shell layer of the VSD material is surface modified to include a polymer.

24. The substrate of claim 19, wherein the core of the VSD material is semiconductive and formed form a metal oxide of a first type, and where the at least one shell layer of the shell are formed from a metal oxide of a second type.

25. The substrate of claim 24, wherein the core of the VSD material is formed from Titanium dioxide ($TiO_2$).

26. The substrate of claim 24, wherein the at least one shell layer of the VSD material include Antimony tin oxide (ATO).

27. The substrate of claim 24, wherein the core of the VSD material is formed from Titanum dioxide ($TiO_2$).

28. The substrate of claim 19, wherein current flows from the first conductive layer to the second conductive layer when the applied voltage exceeds the characteristic level.

* * * * *